United States Patent
Lin et al.

(10) Patent No.: US 11,296,290 B2
(45) Date of Patent: Apr. 5, 2022

(54) PATTERNING METHOD FOR PREPARING TOP-GATE, BOTTOM-CONTACT ORGANIC FIELD EFFECT TRANSISTORS

(71) Applicant: Clap Co., Ltd., Seoul (KR)

(72) Inventors: Wei Hsiang Lin, Gyeonggi-do (KR); Mi Zhou, Ludwigshafen (DE); JunMin Lee, Gyeonggi-do (KR); Giseok Lee, Cheongju-si (KR); Stefan Becker, Ludwigshafen (DE)

(73) Assignee: Clap Co., Ltd., Seoul (KR)

( * ) Notice: Subject to any disclaimer, the term of this patent is extended or adjusted under 35 U.S.C. 154(b) by 0 days.

(21) Appl. No.: 16/978,659

(22) PCT Filed: Feb. 27, 2019

(86) PCT No.: PCT/EP2019/054778
§ 371 (c)(1),
(2) Date: Sep. 4, 2020

(87) PCT Pub. No.: WO2019/170481
PCT Pub. Date: Sep. 12, 2019

(65) Prior Publication Data
US 2021/0036248 A1 Feb. 4, 2021

(30) Foreign Application Priority Data
Mar. 7, 2018 (EP) .................... 18160518

(51) Int. Cl.
*H01L 51/05* (2006.01)
*H01L 51/00* (2006.01)

(52) U.S. Cl.
CPC ...... *H01L 51/0529* (2013.01); *H01L 51/0017* (2013.01); *H01L 51/0537* (2013.01); *H01L 51/0541* (2013.01); *H01L 51/0558* (2013.01)

(58) Field of Classification Search
CPC ............ H01L 51/0529; H01L 51/0017; H01L 51/0541; H01L 51/0558
See application file for complete search history.

(56) References Cited

U.S. PATENT DOCUMENTS

| 7,384,814 B2 | 6/2008 | Huitema et al. |
| 2006/0223218 A1 | 10/2006 | Huitema et al. |
| (Continued) | | |

FOREIGN PATENT DOCUMENTS

| CN | 105 418 357 | 3/2016 |
| GB | 2239248 | 6/1991 |
| (Continued) | | |

OTHER PUBLICATIONS

U.S. Appl. No. 17/285,445, filed Apr. 15, 2021, by Kaelblein et al. (Copy not provided). (Copy not submitted herewith pursuant to the waiver of 37 C.F.R. §1.98(a)(2)(iii) issued by the Office on Sep. 21, 2004).

(Continued)

*Primary Examiner* — Anthony Ho
(74) *Attorney, Agent, or Firm* — Morrison & Foerster LLP

(57) ABSTRACT

The present invention relates to a process for the preparation of a top-gate, bottom-contact organic field effect transistor on a substrate, which organic field effect transistor comprises source and drain electrodes, a semiconducting layer, a cured first dielectric layer and a gate electrode, and which process comprises the steps of: i) applying a composition comprising an organic semiconducting material to form the semiconducting layer, ii) applying a composition comprising a first dielectric material and a crosslinking agent carrying at least two azide groups to form a first dielectric layer, iii) curing portions of the first dielectric layer by light (Continued)

treatment, iv) removing the uncured portions of the first dielectric layer, and v) removing the portions of the semiconducting layer that are not covered by the cured first dielectric layer, wherein the first dielectric material comprises a star-shaped polymer consisting of at least one polymer block A and at least two polymer blocks B, wherein each polymer block B is attached to the polymer block A, and wherein at least 60 mol % of the repeat units of polymer block B are selected from the group consisting of Formulas (1A), (1B), (1C), (1D), (1E) and (1F), wherein $R^1$, $R^2$, $R^3$, $R^4$, $R^5$, $R^6$, $R^7$ and $R^8$ are independently and at each occurrence H or $C_1$-$C_{10}$-alkyl.

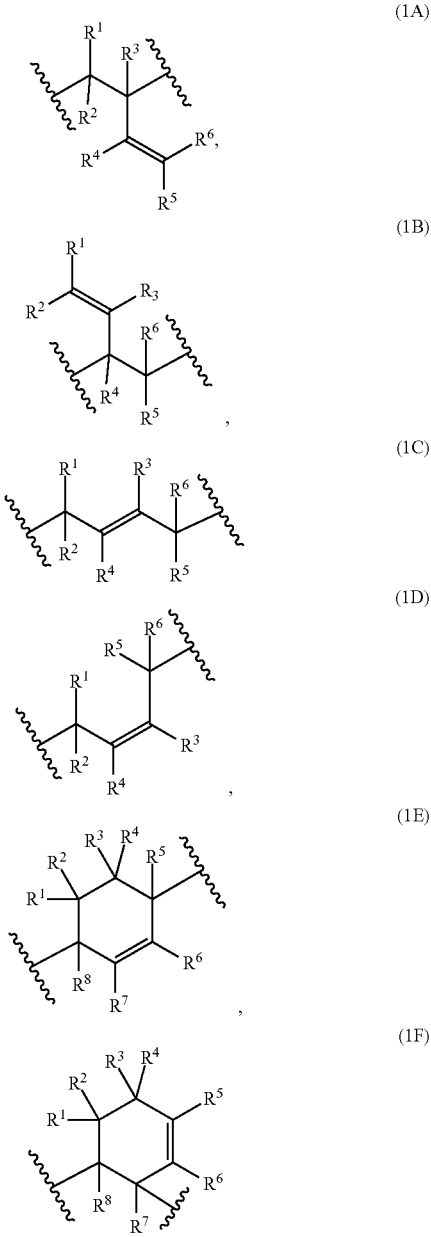

15 Claims, 3 Drawing Sheets

(56) References Cited

U.S. PATENT DOCUMENTS

| | | |
|---|---|---|
| 2011/0121273 A1 | 5/2011 | Jo et al. |
| 2012/0187379 A1 | 7/2012 | Wu et al. |
| 2013/0048949 A1 | 2/2013 | Xia et al. |
| 2016/0254466 A1 | 9/2016 | Koizumi et al. |
| 2017/0141319 A1 | 5/2017 | Noh |
| 2018/0026214 A1 | 1/2018 | Tian |
| 2020/0343458 A1 | 10/2020 | Nekelson et al. |
| 2020/0388772 A1 | 12/2020 | Yamato et al. |
| 2020/0411781 A1 | 12/2020 | Kwon et al. |
| 2021/0277157 A1 | 9/2021 | Kaelblein et al. |

FOREIGN PATENT DOCUMENTS

| | | |
|---|---|---|
| GB | 2472413 | 2/2011 |
| JP | H06 313107 | 11/1994 |
| JP | 2008-096680 | 4/2008 |
| JP | 2008-300752 | 12/2008 |
| JP | 2009-069381 | 4/2009 |
| JP | 2010-087408 | 4/2010 |
| JP | 2010-100844 | 5/2010 |
| JP | 2011-012147 | 1/2011 |
| JP | 2012-169550 | 9/2012 |
| JP | 2015-035475 | 2/2015 |
| JP | 2015-528642 | 9/2015 |
| JP | 2017-143097 | 8/2017 |
| KR | 10-2012-0104067 | 9/2012 |
| KR | 10-2013-0075982 | 7/2013 |
| KR | 10-2013-0135516 | 12/2013 |
| KR | 10-2015-0065184 | 6/2015 |
| WO | WO 2004/100282 | 11/2004 |
| WO | WO 2005/049695 | 6/2005 |
| WO | WO 2007/004995 | 1/2007 |
| WO | WO 2007/068618 | 6/2007 |
| WO | WO 2007/074137 | 7/2007 |
| WO | WO 2007/093643 | 8/2007 |
| WO | WO 2008/000664 | 1/2008 |
| WO | WO 2009/024512 | 2/2009 |
| WO | WO 2009/053291 | 4/2009 |
| WO | WO 2009/068884 | 6/2009 |
| WO | WO 2009/147237 | 12/2009 |
| WO | WO 2010/000669 | 1/2010 |
| WO | WO 2010/000755 | 1/2010 |
| WO | WO 2010/049321 | 5/2010 |
| WO | WO 2010/049323 | 5/2010 |
| WO | WO 2010/108873 | 9/2010 |
| WO | WO 2010/136352 | 12/2010 |
| WO | WO 2010/136353 | 12/2010 |
| WO | WO 2011/060293 | 5/2011 |
| WO | WO 2011/067192 | 6/2011 |
| WO | WO 2011/068482 | 6/2011 |
| WO | WO 2012/041849 | 4/2012 |
| WO | WO 2012/095790 | 7/2012 |
| WO | WO 2012/117089 | 9/2012 |
| WO | WO 2012/146506 | 11/2012 |
| WO | WO 2012/152598 | 11/2012 |
| WO | WO 2012/175530 | 12/2012 |
| WO | WO 2013/004730 | 1/2013 |
| WO | WO 2013/083506 | 6/2013 |
| WO | WO 2013/083507 | 6/2013 |
| WO | WO 2013/150005 | 10/2013 |
| WO | WO 2014/033622 | 3/2014 |
| WO | WO 2014/174435 | 3/2014 |
| WO | WO 2014/115749 | 7/2014 |
| WO | WO 2015/004563 | 1/2015 |
| WO | WO 2015/076334 | 5/2015 |
| WO | WO 2015/193808 | 12/2015 |
| WO | WO 2017/022983 | 2/2017 |
| WO | WO 2018/104367 | 6/2018 |

OTHER PUBLICATIONS

Akazaki et al., "Recognition and One-Pot Extraction of Right- and Left-Handed Semiconducting Single-Walled Carbon Nanotube

(56) References Cited

OTHER PUBLICATIONS

Enantiomers Using Fluorene-Binaphthol Chiral Copolymers," J Am Chem Soc (2012) 134:12700-12707.

Bo et al., "Carbon nanotubes-semiconductor networks for organic electronics: The pickup stick transistor," Applied Physics Letters (2005) 86:182102.

Cai et al., "Exceptional Single-Molecule Transport Properties of Ladder-Type Heteroacene Molecular Wires," J Am Chem Soc (2016) 138(33): 10630-10635.

Cai et al., "Synthesis of Alternating Donor-Acceptor Ladder-Type Molecules and Investigation of Their Multiple Charge-Transfer Pathways," Angew Chem Int Ed Engl. (2018) 57(22):6442-6448.

Database Caplus [Online] Chemical Abstracts Service, Columbus, Ohio, US; Dec. 12, 2008 (Dec. 12, 2008), Nakatsuka, Masakatsu; Fujiyama, Takahiro; Toya, Yoshiyuki: 11 Organic transistors containing thiophene derivatives with high charge mobility, on/off current ratio, and storage stability 11 , XP002789822, retrieved from STN Database accession No. 2008:1483593 abstract.

Green et al., "Sorting carbon nanotubes by electronic structure using density differentiation," Nature Nantoech (2006) 1:60-65.

Ha et al., "Highly Stable Hysteresis-Free Carbon Nanotube Thin-Film Transistors by Fluorocarbon Polymer Encapsulation," ACS Appl Mater Interfaces (2014) 6:8441-8446.

Hsieh et al., "High performance nanocomposite thin film transistors with bilayer carbon nanotube-polythiophene active channel by ink-jet printing," J Appl Phys (2009) 106:123706.

Krupke et al., "Separation of Metallic from Semiconducting Single-Walled Carbon Nanotubes," Science (2003) 301:344-347.

Lei et al., "Diketopyrrolopyrrole (DPP)-Based Donor-Acceptor Polymers for Selective Dispersion of Large-Diameter Semiconducting Carbon Nanotubes," Small (2015) 11(24):2946-2954.

Liu et al., "Organic semiconductor-carbon nanotube bundle bilayer field effect transistors with enhanced mobilities and high on/off ratios," Appl Phys Lett (2008) 92:053306.

Liu et al., "Selective Crystallization of Organic Semiconductors on Patterned Templates of Carbon Nanotubes**," Adv Funct Mater (2007) 17:2891-2896.

Miyata et al., "Length-Sorted Semiconducting Carbon Nanotubes for High-Mobility Thin Film Transistors," Nan Res (2011) 4(10):963-970.

Rafiq et al., "Synthesis of Annulated Thiophenes Involving Benzo-DMTHFs/Triflic acid-Mediated Domino Reactions," Chemistry Select (2017) 2:2578-2582.

Zhang et al., "Indacenodithiophene semiconducting polymers for high-performance, air-stable transistors," J Am Chem Soc. (2010) 132(33): 11437-11439.

Zheng et al., "Roles of Quinoidal Character and Regioregularity in Determining the Optoelectronic and Photovoltaic Properties of Conjugated Copolymers," Macromolecules (2014) 47:18; 6252-6259.

Cai et al., "Development of Highly Efficient Deep-UV and Electron Beam Mediated Cross-Linkers: Synthesis and Photolysis of Bis(perfluorophenyl) Azides," Chem Mater (1994) 6:1822-1829.

Campaigne et al., "Some methyl substituted benzo[b]naphtho[2,3-d]thiophenes," Jnl Heterocyclic Chem. (1969) (6)6: 885-889.

Hirao et al., "Recent advance in syntheses and applications of well-defined endfunctionalized polymers by means of anionic living polymerization," Acta Polym (1999) 50:219-231.

Kimura et al., "Soluble Organic Semiconductor Precursor With Specific Phase Separation for High-Performance Printed Organic Transistors," Adv Mater. (2015) 27(4): 727-732.

Mitsui et al., "High-performance Solution-Processable N-shaped Organic Semiconducting Materials With Stabilized Crystal Phase," Adv Mater (2014) 26(26): 4546-4551.

Nielsen et al., "Recent Advances in the Development of Semiconducting DPP-Containing Polymers for Transistor Applications," Adv Mater (2012) DOI: 10.1002/adma.201201795.

Okamoto et al., "V-shaped Organic Semiconductors With Solution Processability, High Mobility, and High Thermal Durability," Adv Mater (2013) (44):6392-6397.

Pham et al., "Aromatic Homologation by Non-Chelate-Assisted Rh(III)-catalyzed C—H Functionalization of Arenes With Alkynes," Angew Chem Int Ed Engl. (2014) 53(13): 3484-3487.

Png et al., "High-performance polymer semiconducting heterostructure devices by nitrene-mediated photocrosslinking of alkyl side chains," Nature Materials (2010) 9:152-158.

Pratap et al., "Synthesis of benzo[b]phenanthro[d]thiophenes," Jnl Heterocyclic Chem. (1982) (19)1: 865-869

Smithson et al., "Using unsorted single-wall carbon nanotubes to enhance mobility of diketopyrrolopyrrole-quarterthiophene copolymer in thin-film transistors," Organnic Electronics (2014) 15:2639-2646.

Touwslager et al., "I-Line lithography of poly-(3,4-ethylenedioxythiophene) electrodes and application in all-polymer integrated circuits," Appl Phys Lett (2002) 81:4556.

Yan et al., "Evaluation of bis ( perfluorophenyl azide) s as cross-linkers for a soluble polyimide," J Mater Chem (1996) 6(8):1249-1252.

PATTERNING METHOD FOR PREPARING TOP-GATE, BOTTOM-CONTACT ORGANIC FIELD EFFECT TRANSISTORS

CROSS REFERENCE TO RELATED APPLICATIONS

This application is a national stage application under 35 U.S.C. § 371 of International Application No. PCT/EP2019/054778, filed internationally on Feb. 27, 2019, which claims priority to European Patent Application No. 18160518.9, filed Mar. 7, 2018, the contents of which are incorporated herein by reference in their entirety.

The present invention relates to a process for the preparation of a top-gate, bottom-contact organic field effect transistor and to a top gate, bottom-contact organic field effect transistor.

Organic field effect transistors (OFETs) can be used in many applications that require electronic functionalities such as displays, large-area sensors and radio-frequency identification (RFID) tags. OFETs can have a top-gate or bottom-gate architecture. Top-gate, bottom-contact organic field effect transistors can comprise, in the following order, a substrate, source and drain electrodes, one organic semiconducting layer, at least one dielectric layer and a gate electrode.

U.S. Pat. No. 7,384,814 describes a method of manufacturing a top-gate, bottom contact organic field effect transistor with a patterned organic semiconducting layer, in which process the organic semiconducting layer and the dielectric layer on top of the semiconducting layer are patterned together in one step. In a preferred embodiment, the dielectric layer is light curable, and the patterning of the semiconducting layer and the dielectric layer is performed by exposing the dielectric layer to the appropriate light via a mask, removing those parts of the dielectric layer not cured by the light, followed by etching away those parts of the semiconducting layer not covered by the cured dielectric layer. Examples of dielectric layers that are light curable are HPR504, a formulation comprising ethyl lactate, novolac resin and 1-naphthalenesulfonic acid, 6-diazo-5,6-dihydro-5-oxo-, 1,1',1"-(1,3,5-benzenetriyl) ester, and SC100, a cyclic polyisoprene.

It was the object of the present invention to provide a process for the preparation of a top gate, bottom-contact organic field effect transistor of improved performance, wherein the semiconducting layer and at least one dielectric layer are patterned together using low dosage UV light treatment under ambient conditions.

This object is solved by the provided process and the provided top-gate, bottom-contact organic field effect transistor.

The process of the present invention is a process for the preparation of a top-gate, bottom-contact organic field effect transistor on a substrate, which organic field effect transistor comprises source and drain electrodes, a semiconducting layer, a cured first dielectric layer and a gate electrode, and which process comprises the steps of i) applying a composition comprising an organic semiconducting material to form the semiconducting layer, ii) applying a composition comprising a first dielectric material and a crosslinking agent carrying at least two azide groups to form a first dielectric layer, iii) curing portions of the first dielectric layer by light treatment, iv) removing the uncured portions of the first dielectric layer, and v) removing the portions of the semiconducting layer that are not covered by the cured first dielectric layer, wherein the first dielectric material comprises a star-shaped polymer consisting of at least one polymer block A and at least two polymer blocks B, wherein each polymer block B is attached to the polymer block A, and wherein at least 60 mol % of the repeat units of polymer block B are selected from the group consisting of

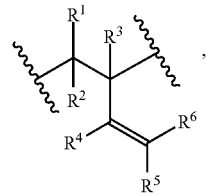

(1A)

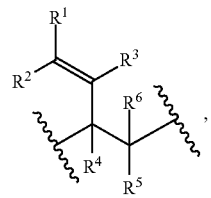

(1B)

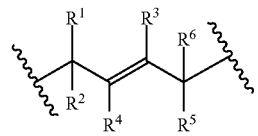

(1C)

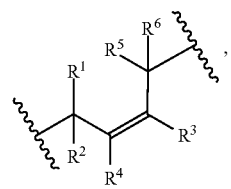

(1D)

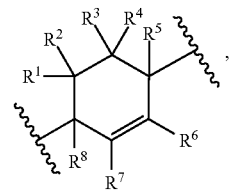

(1E)

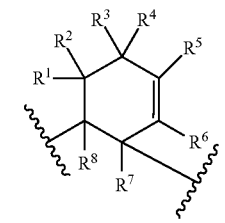

(1F)

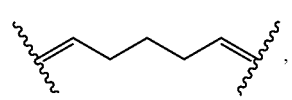

(1G)

-continued

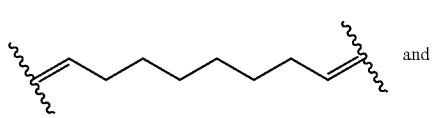 and (1H)

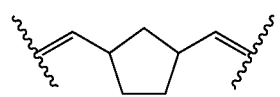 (1I)

wherein $R^1$, $R^2$, $R^3$, $R^4$, $R^5$, $R^6$, $R^7$ and $R^8$ are independently and at each occurrence H or $C_1$-$C_{10}$-alkyl.

If the star-shaped polymer is a polymer consisting of one polymerblock A and two polymerblocks B, the star-shaped polymer is also called a triblockpolymer.

$C_{1-4}$-alkyl, $C_{1-6}$-alkyl, $C_{1-10}$-alkyl, $C_{1-20}$-alkyl, $C_{1-30}$-alkyl and $C_{6-30}$-alkyl can be branched or unbranched (linear). If branched, $C_{1-4}$-alkyl, $C_{1-6}$-alkyl, $C_{1-10}$-alkyl, $C_{1-20}$-alkyl and $C_{1-30}$-alkyl are preferably branched at the C2-atom. Examples of $C_{1-4}$-alkyl are methyl, ethyl, butyl, iso-butyl, sec-butyl and tert-butyl. Examples of $C_{1-6}$-alkyl are methyl, ethyl, n-propyl, isopropyl, n-butyl, sec-butyl, isobutyl, tert-butyl, n-pentyl, neopentyl, isopentyl, n-(1-ethyl)propyl and n-hexyl. Examples of $C_{1-10}$-alkyl are $C_{1-6}$-alkyl and n-heptyl, n-octyl, n-(2-ethyl)hexyl, n-nonyl, n-decyl. Examples of $C_{1-20}$-alkyl are $C_{1-10}$-alkyl and n-undecyl, n-dodecyl, n-undecyl, n-dodecyl, n-tridecyl, n-tetradecyl, n-(2-butyl)decyl, n-pentadecyl, n-hexadecyl, n-heptadecyl, n-octadecyl, n-nonadecyl, n-(2-hexyl)tetradecyl and n-icosyl ($C_{20}$). Examples of $C_{1-30}$-alkyl are $C_{1-20}$-alkyl and n-docosyl ($C_{22}$), n-(2-decyl)dodecyl, n-tetracosyl ($C_{24}$), n-hexacosyl ($C_{26}$), n-octacosyl ($C_{28}$) and n-triacontyl ($C_{30}$). Examples of $C_{6-30}$-alkyl are n-hexyl, n-heptyl, n-octyl, n-(2-ethyl)hexyl, n-nonyl, n-decyl, n-undecyl, n-dodecyl, n-undecyl, n-dodecyl, n-tridecyl, n-tetradecyl, n-(2-butyl)decyl, n-pentadecyl, n-hexadecyl, n-heptadecyl, n-octadecyl, n-nonadecyl, n-(2-hexyl)tetradecyl, n-icosyl, n-docosyl ($C_{22}$), n-(2-decyl)dodecyl, n-tetracosyl ($C_{24}$), n-hexacosyl ($C_{26}$), n-octacosyl ($C_{28}$) and n-triacontyl ($C_{30}$).

Examples of $C_{6-14}$-aryl are phenyl and naphthyl.
Examples of 5 to 14 membered heteroaryl are

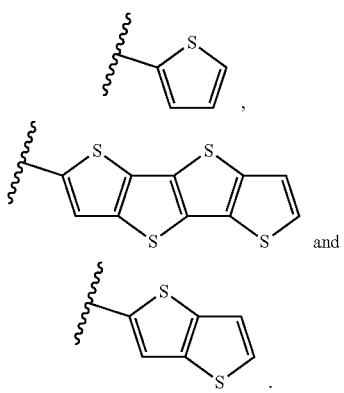.

Examples of $C_{1-10}$-alkylene are methylene, ethylene, propylene, butylene, pentylene, hexylene, heptylene, octylene, nonylene and decylene.

Examples of $C_{2-10}$-alkenylene are ethenylene, propenylene, butenylene, pentenylene, hexenylene, heptenylene, octenylene, nonenylene and decenylene.

Examples of $C_{2-10}$-alkynylene are ethynylene, propynylene, butynylene, pentynylene, hexynylene, heptynylene, octynylene, nonynylene and decynylene.

Examples of $C_{6-14}$-arylene are

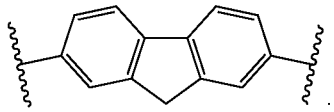 [SMILES: *c1ccc2c(c1)Cc1cc(*)ccc1-2].

Examples of $C_{5-8}$-cycloalkylene are cyclopentylene, cyclohexylene, cycloheptylene and cyclooctylene.

Examples of 5 to 14 membered heteroarylene are

[structures shown]

An example of a polycyclic system containing at least one ring selected from the group consisting of $C_{6-14}$-aromatic ring and 5 to 14 membered heteroaromatic ring is

[fluorene structure].

Examples of halogen are F, Cl, Br and I.

Preferably, $R^1$, $R^2$, $R^3$, $R^4$, $R^5$ and $R^6$ are independently and at each occurrence H or $C_{1-4}$-alkyl.

More preferably, $R^1$, $R^2$, $R^3$, $R^4$, $R^5$ and $R^6$ are H.

Preferably, at least 60 mol % of the monomer units of polymerblock B are selected from the group consisting of

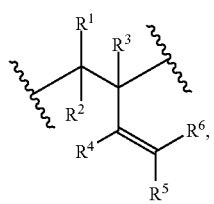 (1A)

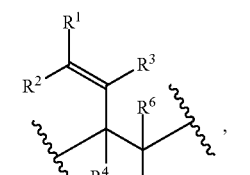 (1B)

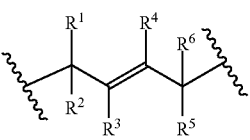 (1C)

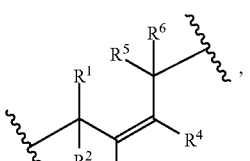 (1D)

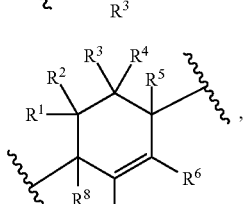 (1E)

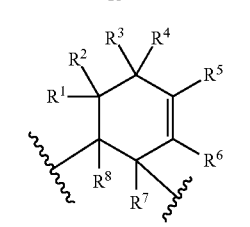 (1F)

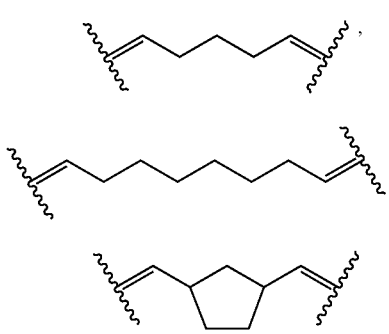

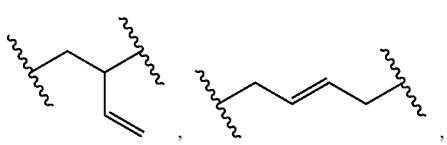

wherein
$R^1$, $R^2$, $R^3$, $R^4$, $R^5$, $R^6$, $R^7$ and $R^8$ are independently and at each occurrence H or $C_{1-4}$-alkyl.

Examples of monomer units of formula 1A, 1B, 1C and 1D are

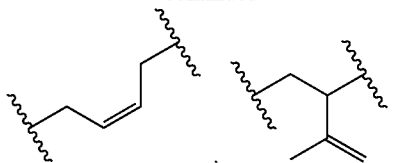

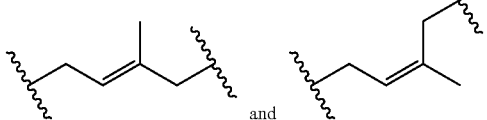

Examples of monomer units of formula 1E and 1F are

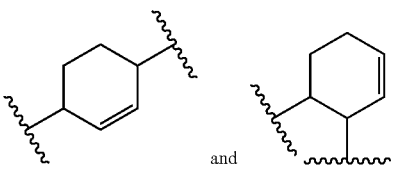

More preferably, at least 70 mol % of the monomer units of the polymerblock B are selected from the group consisting of

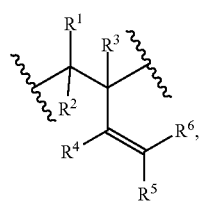 (1A)

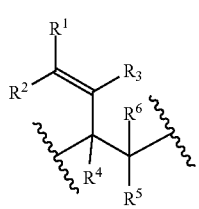 (1B)

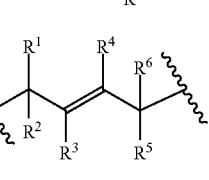 (1C)

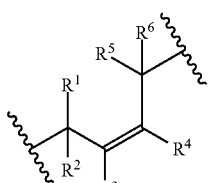 (1D)

wherein
$R^1$, $R^2$, $R^3$, $R^4$, $R^5$ and $R^6$ are independently and at each occurrence H or $C_{1-4}$-alkyl.

More preferably, at least 80 mol % of the monomer units of the polymerblock B are selected from the group consisting of

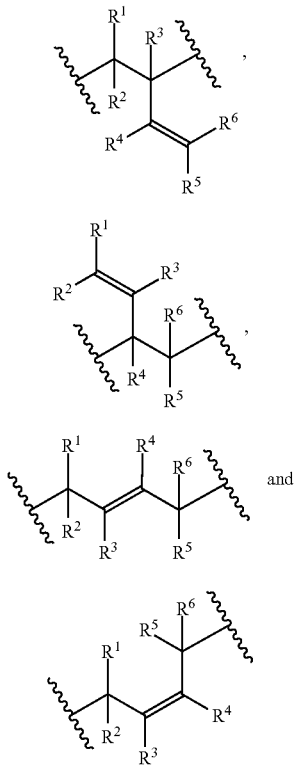

wherein
$R^1$, $R^2$, $R^3$, $R^4$, $R^5$ and $R^6$ are H.

The polymerblock B can contain further monomer units, such as monomer units (4A), (4C), (4D), (4E) or (4F). However, most preferred, polymerblock B essentially consists of monomer units selected from the group consisting of (1A), (1B), (1C), (1D), (1E), (1F), (1G), (1H) and (1I).

The polymerblock A can consist of any suitable monomer units.

Preferably, at least 80 mol % of the monomer units of polymerblock A are selected from the group consisting of

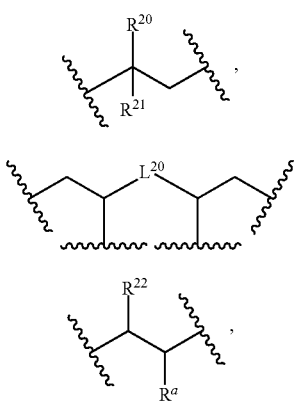

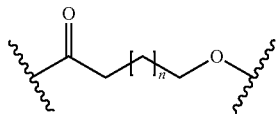

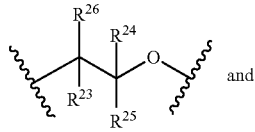

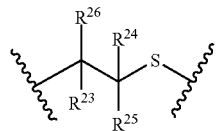

wherein $R^{20}$, $R^{21}$, $R^{22}$, $R^{23}$, $R^{24}$, $R^{25}$ and $R^{26}$ are independently and at each occurrence selected from the group consisting of H, $C_{6-14}$-aryl, 5 to 14 membered heteroaryl and $C_{1-30}$-alkyl, and $R^a$ is C(O)OH, C(O)O$C_{1-30}$-alkyl, C(O)—H, C(O)$C_{6-14}$-aryl, C(O)N($C_{1-30}$-alkyl)$_2$, C(O)N($C_{6-14}$-aryl)$_2$, C(O)N($C_{1-30}$-alkyl)($C_{6-14}$-aryl), C(O)—$C_{6-14}$-aryl, C(O)—$C_{1-30}$-alkyl, O—$C_{6-14}$-aryl, O—$C_{1-30}$-alkyl, OC(O)$C_{1-30}$-alkyl, OC(O)$C_{6-14}$-aryl or CN, wherein $C_{6-14}$-aryl and 5-14 membered heteroaryl can be substituted with one or more substituents selected from the group consisting of $C_{1-10}$-alkyl, C(O)OH, C(O)O$C_{1-10}$-alkyl, C(O)phenyl, C(O)N($C_{1-10}$-alkyl)$_2$, C(O)N(phenyl)$_2$, C(O)N($C_{1-10}$-alkyl)(phenyl), C(O)-phenyl, C(O)—$C_{1-10}$-alkyl, OH, O-phenyl, O—$C_{1-10}$-alkyl, OC(O)$C_{1-10}$-alkyl, OC(O)-phenyl, ON and NO$_2$, and $C_{1-30}$-alkyl can be substituted with one or more substituents selected from the group consisting of phenyl, C(O)OH, C(O)O$C_{1-10}$-alkyl, C(O)phenyl, C(O)N($C_{1-10}$-alkyl)$_2$, C(O)N(phenyl)$_2$, C(O)N($C_{1-10}$-alkyl)(phenyl), C(O)-phenyl, C(O)—$C_{1-10}$-alkyl, O-phenyl, O—$C_{1-10}$-alkyl, OC(O)$C_{1-10}$-alkyl, OC(O)-phenyl, Si($C_{1-10}$-alkyl)$_3$, Si(phenyl)$_3$, ON and NO$_2$, n is an integer from 1 to 3, and $L^{20}$ is $C_{1-10}$-alkylene, $C_{2-10}$-alkenylene, $C_{2-10}$-alkynylene, $C_{6-14}$-arylene or S(O).

Examples of monomer units 4A are

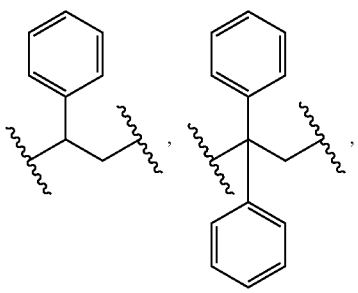

-continued

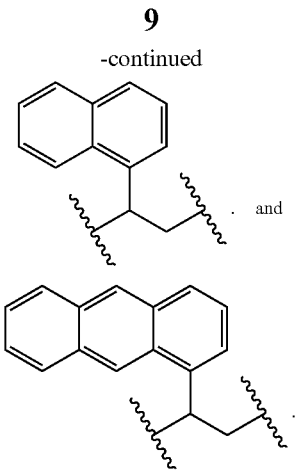
and

An examples of a monomer unit 4B is

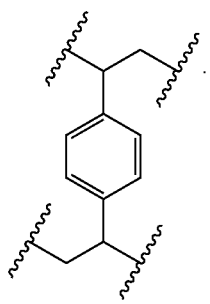

Examples of monomer units 4C are

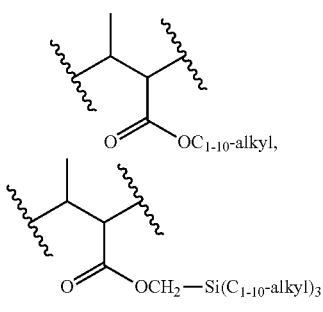

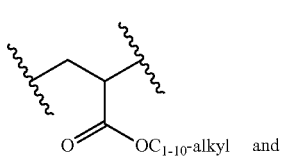 and

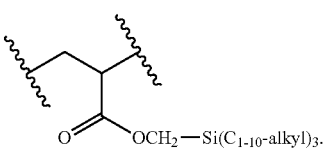

More preferably, at least 80 mol % of the monomer units of polymerblock A are selected from the group consisting of

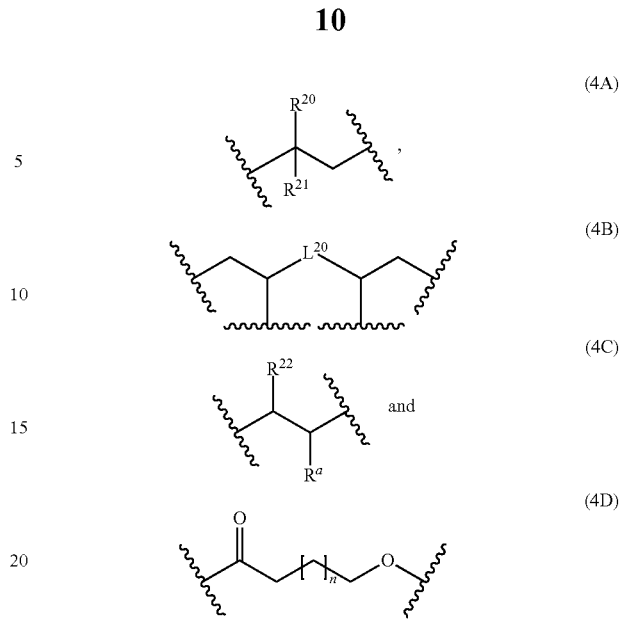

wherein
$R^{20}$, $R^{21}$ and $R^{22}$ are independently selected from the group consisting of H, $C_{6-14}$-aryl, 5 to 14 membered heteroaryl and $C_{1-30}$-alkyl, and
$R^a$ is $C(O)OC_{1-30}$-alkyl,
wherein
$C_{6-14}$-aryl and 5-14 membered heteroaryl can be substituted with one or more $C_{1-10}$-alkyl, and
$C_{1-30}$-alkyl can be substituted with one or more substituents selected from the group consisting of $Si(C_{1-10}\text{-alkyl})_3$ and $Si(phenyl)_3$,
and
n is an integer from 1 to 3, and
$L^{20}$ is $C_{1-10}$-alkylene or $C_{6-14}$-arylene.

Even more preferably, at least 90 mol % of the monomer units of polymerblock A is a monomer unit selected from the group consisting of

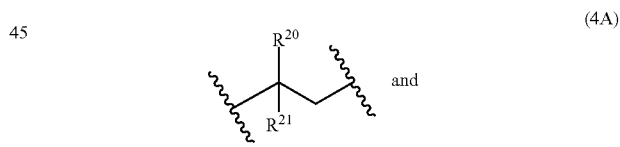

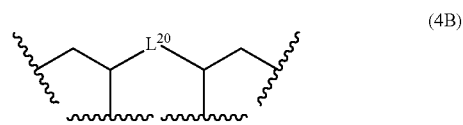

wherein
$R^{20}$ and $R^{21}$ are independently selected from the group consisting of H and $C_{6-14}$-aryl,
wherein
$C_{6-14}$-aryl can be substituted with one or more $C_{1-10}$-alkyl,
and
$L^{20}$ is $C_{6-14}$-arylene.

Most preferably, at least 90 mol % of the monomer units of polymerblock A is a monomer unit selected from the group consisting of

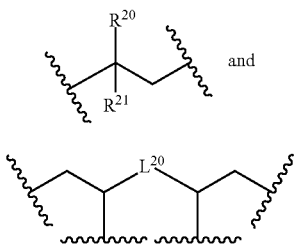 (4A)

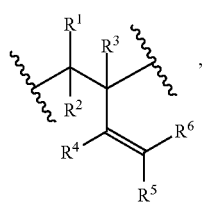 (4B)

wherein
R²⁰ and R²¹ are independently selected from the group consisting of H and phenyl, and
L²⁰ is phenylene.

The polymerblock A can additionally contain further monomer units, such as the monomer units (1A), (1B), (1C), (1D), (1E), (1F), (1G), (1H) and (1I). However, most preferred, polymerblock A essentially consists of monomer units selected from the group consisting of (4A), (4B), (4C), (4D), (4E) and (4F).

In one embodiment of the present invention, the star-shaped polymer consists of one polymerblock A and more than two polymerblocks B.

In another embodiment of the present invention, the star-shaped polymer is a triblock polymer consisting of one polymerblock A and two polymerblocks B.

Preferably, the star-shaped polymer is a triblock polymer consisting of one polymerblock A and two polymerblocks B, wherein each polymerblock B is attached to the polymerblock A, and wherein
at least 60 mol % of the monomer units of polymerblock B are selected from the group consisting of

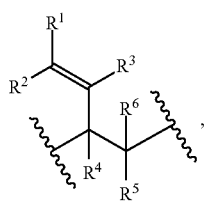 (1A)

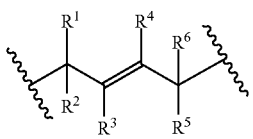 (1B)

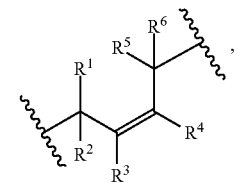 (1C)

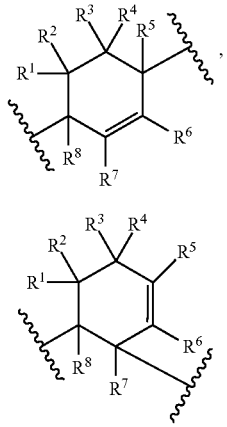 (1D)

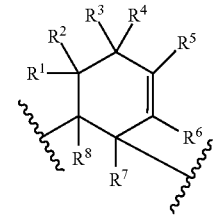 (1E)

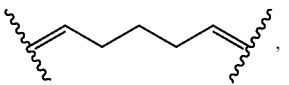 (1F)

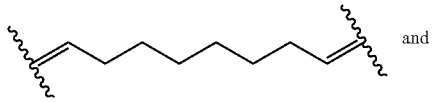 (1G)

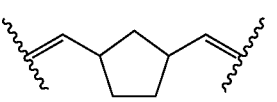 (1H) and (1I)

wherein
R¹, R², R³, R⁴, R⁵, R⁶, R⁷ and R⁸ are independently and at each occurrence H or $C_{1-4}$-alkyl,
with the proviso that at least one of the monomer units (1A) and (1B) is present, and that the ratio of [mols of monomer units (1A) and (1B)]/[mols of monomer units (1A), (1B), (1C) and (1D)] is at least 30%.

Preferably, at least 70 mol % of the monomer units of the polymerblock B of the triblock polymer are selected from the group consisting of

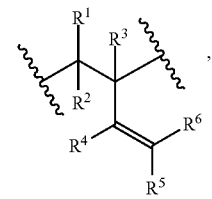 (1A)

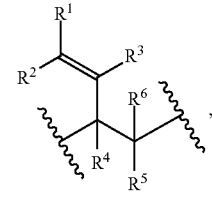 (1B)

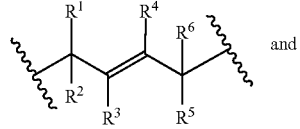 (1C) and

-continued

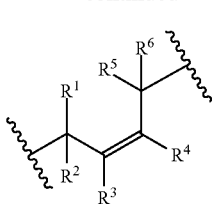
(1D)

wherein
$R^1$, $R^2$, $R^3$, $R^4$, $R^5$ and $R^6$ are independently and at each occurrence H or $C_{1-4}$-alkyl,
with the proviso that at least one of the monomer units (1A) and (1B) is present, and that the ratio of [mols of monomer units (1A) and (1B)]/[mols of monomer units (1A), (1B), (1C) and (1D)] is at least 50%.

More preferably, at least 80 mol % of the monomer units of the polymerblock B of the triblock polymer are selected from the group consisting of

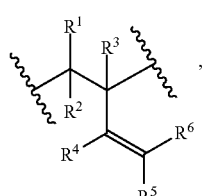
(1A)

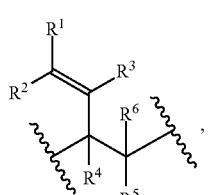
(1B)

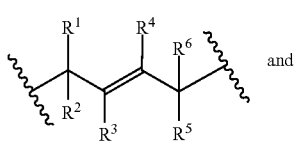
and
(1C)

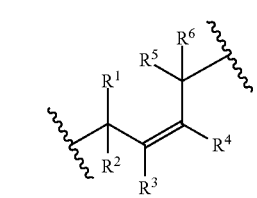
(1D)

wherein
$R^1$, $R^2$, $R^3$, $R^4$, $R^5$ and $R^6$ are H,
with the proviso that at least one of the monomer units (1 A) and (1B) is present, and that the ratio of [mols of monomer units (1A) and (1B)]/[mols of monomer units (1A), (1B), (1C) and (1D)] is at least 70%.

The polymerblock B of the triblock polymer can contain further monomer units, such as monomer units (4A), (4C), (4D), (4E) or (4F). However, most preferred, polymerblock B essentially consists of monomer units selected from the group consisting of (1A), (1B), (1C), (1D), (1E), (1F), (1G), (1H) and (1I).

Preferably, at least 80 mol % of the monomer units of polymerblock A of the triblock polymer are selected from the group consisting of

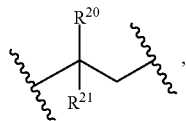
(4A)

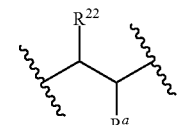
(4C)

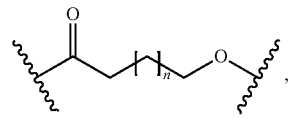
(4D)

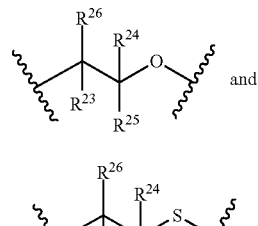
and
(4E)

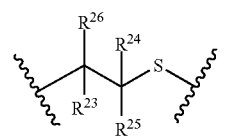
(4F)

wherein
$R^{20}$, $R^{21}$, $R^{22}$, $R^{23}$, $R^{24}$, $R^{25}$ and $R^{26}$ are independently and at each occurrence selected from the group consisting of H, $C_{6-14}$-aryl, 5 to 14 membered heteroaryl and $C_{1-30}$-alkyl, and
$R^a$ is C(O)OH, C(O)O$C_{1-30}$-alkyl, C(O)—H, C(O)$C_{6-14}$-aryl, C(O)N($C_{1-30}$-alkyl)$_2$, C(O)N($C_{6-14}$-aryl)$_2$, C(O)N($C_{1-30}$-alkyl)($C_{6-14}$-aryl), C(O)—$C_{6-14}$-aryl, C(O)—$C_{1-30}$-alkyl, O—$C_{6-14}$-aryl, O—$C_{1-30}$-alkyl, OC(O)$C_{1-30}$-alkyl, OC(O)$C_{6-14}$-aryl or CN, wherein
$C_{6-14}$-aryl and 5-14 membered heteroaryl can be substituted with one or more substituents selected from the group consisting of $C_{1-10}$-alkyl, C(O)OH, C(O)O$C_{1-10}$-alkyl, C(O)phenyl, C(O)N($C_{1-10}$-alkyl)$_2$, C(O)N(phenyl)$_2$, C(O)N($C_{1-10}$-alkyl)(phenyl), C(O)-phenyl, C(O)—$C_{1-10}$-alkyl, OH, O-phenyl, O—$C_{1-10}$-alkyl, OC(O)$C_{1-10}$-alkyl, OC(O)-phenyl and CN and NO$_2$, and $C_{1-30}$-alkyl can be substituted with one or more substituents selected from the group consisting of with phenyl, C(O)OH, C(O)O$C_{1-10}$-alkyl, C(O)phenyl, C(O)N($C_{1-10}$-alkyl)$_2$, C(O)N(phenyl)$_2$, C(O)N($C_{1-10}$-alkyl)(phenyl), C(O)-phenyl, C(O)—$C_{1-10}$-alkyl, O-phenyl, O—$C_{1-10}$-alkyl, OC(O)$C_{1-10}$-alkyl, OC(O)-phenyl, Si($C_{1-10}$-alkyl)$_3$, Si(phenyl)$_3$ and CN and NO$_2$, and n is an integer from 1 to 3.

More preferably, at least 80 mol % of the monomer units of polymerblock A of the triblock polymer are selected from the group consisting of

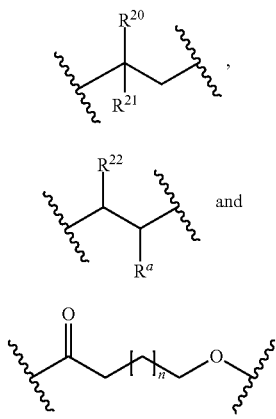

(4A)

(4C) and (4D)

wherein $R^{20}$, $R^{21}$ and $R^{22}$ are independently selected from the group consisting of H, $C_{6-14}$-aryl, 5 to 14 membered heteroaryl and $C_{1-30}$-alkyl, and $R^a$ is $C(O)OC_{1-30}$-alkyl, wherein $C_{6-14}$-aryl and 5-14 membered heteroaryl can be substituted with one or more $C_{1-10}$-alkyl, and $C_{1-30}$-alkyl can be substituted with one or more substituents selected from the group consisting of $Si(C_{1-10}\text{-alkyl})_3$ and $Si(phenyl)_3$, and n is an integer from 1 to 3.

Most preferably, at least 80 mol % of the monomer units of polymerblock A of the triblock polymer are monomer units selected from the group consisting of

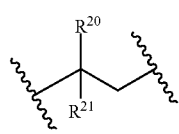

(4A)

wherein $R^{20}$ and $R^{21}$ are independently selected from the group consisting of H and $C_{6-14}$-aryl, wherein $C_{6-14}$-aryl can be substituted with one or more $C_{1-10}$-alkyl.

The polymerblock A of the triblock polymer can additionally contain further monomer units, such as the monomer units (1A), (1B), (1C), (1D), (1E), (1F), (1G), (1H) and (1I). However, most preferred, polymerblock A of the triblock polymer essentially consists of monomer units selected from the group consisting of (4A), (4C), (4D), (4E) and (4F).

More preferably, the star-shaped polymer is a triblock polymer consisting of one polymerblock A and two polymerblocks B, wherein at least 70 mol % of the monomer units of the polymerblock B are selected from the group consisting of

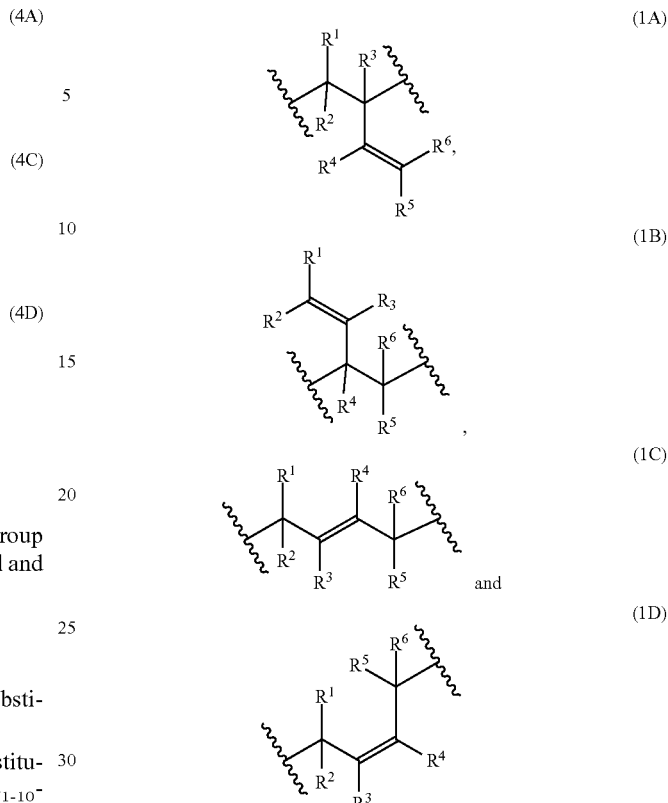

wherein $R^1$, $R^2$, $R^3$, $R^4$, $R^5$ and $R^6$ are independently and at each occurrence H or $C_{1-4}$-alkyl, with the proviso that at least one of the monomer units 1A and 1B is present, and that the ratio of [mols of monomer units 1A and 1B]/[mols of monomer units 1A, 1B, 1C and 1D] is at least 50%, and at least 80 mol % of the monomer units of polymerblock A is a monomer unit of formula

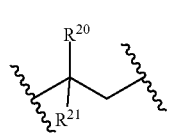

(4A)

wherein $R^{20}$ is H, and $R^{21}$ is at each occurrence $C_{6-14}$-aryl, wherein $C_{6-14}$-aryl can be substituted with one or more $C_{1-10}$-alkyl.

Even more preferably, the star-shaped polymer of the present invention is a triblock polymer consisting of one polymerblock A and two polymerblocks B, wherein at least 80 mol % of the monomer units of the polymerblock B are selected from the group consisting of

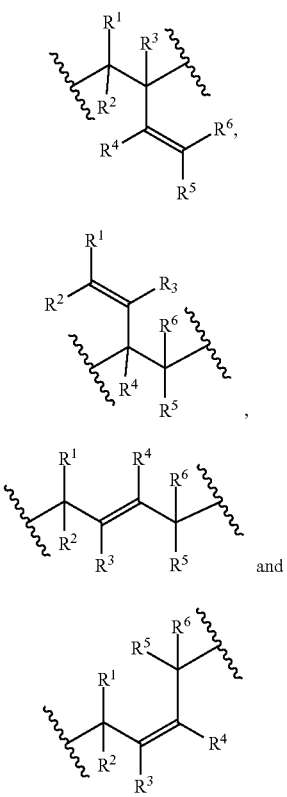

(1A)

(1B)

(1C) and (1D)

wherein
$R^1$, $R^2$, $R^3$, $R^4$, $R^5$ and $R^6$ are H,
with the proviso that at least one of the monomer units 1A and 1B is present, and that the ratio of [mols of monomer units 1A and 1B]/[mols of monomer units 1A, 1B, 1C and 1D] is at least 70%, and
at least 90 mol % of the monomer units of polymerblock A is a monomer unit of formula

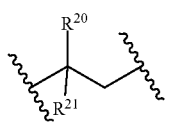

(4A)

wherein
$R^{20}$ is H and, $R^{21}$ is phenyl.

The following definitions and preparation methods regarding polymers, including definitions and preparation methods regarding polymerblock B and polymerblock A, apply to the star-shaped polymers, including the triblock polymers.

Preferably, the weight ratio of polymerblock A/total polymerblocks B is from 60/40 to 96/4. More preferably, the weight ratio of polymerblock A/total polymerblocks B is from 70/30 to 96/4. Most preferably, the weight ratio of polymerblock A/total polymerblocks B is from 76/24 to 94/4.

Preferably, the star-shaped polymers have a number average molecular weight Mn of at least 60000 g/mol and a weight average molecular weight Mw of at least 70000 g/mol, both as determined by gel permeation chromatography.

More preferably, the star-shaped polymers have a number average molecular weight Mn of at least 100000 g/mol and a weight average molecular weight Mw of at least 120000 g/mol, both as determined by gel permeation chromatography.

Most preferably, the star-shaped polymers have a number average molecular weight Mn of at least 120000 g/mol and a weight average molecular weight Mw of at least 150000 g/mol, both as determined by gel permeation chromatography.

It is assumed that the total monomers used in the preparation of polymerblock B are incorporated in polymerblock B.

It is assumed that mol % of the monomer units (1A), (1B), (1C) and (1D) is equal to mol % of monomer

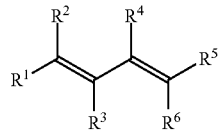

(5A)

wherein
$R^1$, $R^2$, $R^3$, $R^4$, $R^5$ and $R^6$ are as defined for monomer units (1A), (1B), (1C) and (1D),
based on total mols of monomers used in the preparation of polymerblock B.

The ratio of [mols of monomer units (1A) and (1B)]/[mols monomer units (1C) and (1D)] can be determined from the integrated signals obtained by $^1$H-NMR allowing sufficient time for full relaxation of the signals. From this data, the ratio of [mols of monomer units (1A) and (1B)]/[mols of monomer units (1A), (1B), (1C) and (1D)] can be calculated.

It is assumed that mol % of the monomer units (1E) and (1F) in polymerblock B is equal to mol % of monomer

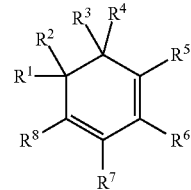

(5B)

wherein
$R^1$, $R^2$, $R^3$, $R^4$, $R^5$, $R^6$, $R^7$ and $R^8$ are as defined for monomer units (1E) and (1F),
based on total mols of monomers used in the preparation of polymerblock B.

It is assumed that mol % of the monomer units (1G) in polymerblock B is equal to mol % of monomer

(5C)

based on total mols of monomers used in the preparation of polymerblock B.

It is assumed that mol % of the monomer units (1H) in polymerblock B is equal to mol % of monomer

 (5D)

based on total mols of monomers used in the preparation of polymerblock B.

It is assumed that mol % of the monomer units (1I) in polymerblock B is equal to mol % of monomer

 (5E)

based on total mols of monomers used in the preparation of polymerblock B.

It is assumed that all monomers used in the preparation of polymerblock A are incorporated in polymerblock A.

Thus, it is assumed that mol % of the monomer units (4A) in polymerblock A is equal to mol % of monomer

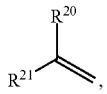 (6A)

wherein
$R^{20}$ and $R^{21}$ are as defined for monomer unit (4A), based on the total mols of monomers used in the preparation of polymerblock A.

It is assumed that mol % of the monomer units (4B) in polymerblock A is equal to the mol % of monomer

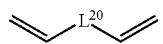 (6B)

wherein $L^{20}$ is as defined for monomer units (4B), based on the total mols of monomers used in the preparation of polymerblock A.

It is assumed that mol % of the monomer units (4C) in polymerblock A is equal to the mol % of monomer

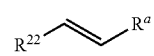 (6C)

wherein
$R^{22}$ and $R^a$ are is as defined for monomer unit (4C), based on the total mols of monomers used in the preparation of polymerblock A.

It is assumed that mol % of the monomer units (4D) in polymerblock A is equal to the mol % of monomer

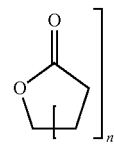 (6D)

wherein
n is as defined for monomer unit (4D), based on the total mols of monomers used in the preparation of polymerblock A.

It is assumed that mol % of the monomer units (4E) in polymerblock A is equal to the mol % of monomer

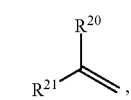 (6E)

wherein
$R^{23}$, $R^{24}$, $R^{25}$ and $R^{26}$, are as defined for monomer unit (4E), based on the total mols of monomers used in the preparation of polymerblock A.

It is assumed that mol % of the monomer units (4F) in polymerblock A is equal to the mol % of monomer

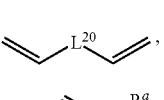 (6F)

wherein
$R^{23}$, $R^{24}$, $R^{25}$ and $R^{26}$ are as defined for monomer unit (4F), based on the total mols of monomers used in the preparation of polymerblock A.

The star-shaped polymers consisting of one polymerblock A and at least two polymerblocks B can be prepared by polymerisation methods known in the art.

For example, polymerbock A can be prepared by anionic polymerisation methods using at least 80 mol % of monomers selected from the group consisting of

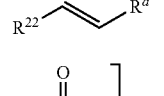 (6A)

(6B)

(6C)

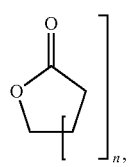 (6D)

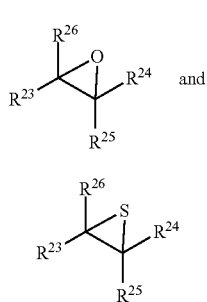

(6E)

(6F)

wherein
$R^1, R^2, R^3, R^4, R^5, R^6, R^7$ and $R^8$ are as defined for monomer units (4A), (4B), (4C), (4D), (4E) and (4F),
based on total mols of monomers used in the preparation of polymerblock A.

For example, polymerbock B can be prepared by anionic polymerisation methods using at least 60 mol % of monomers selected from the group consisting of

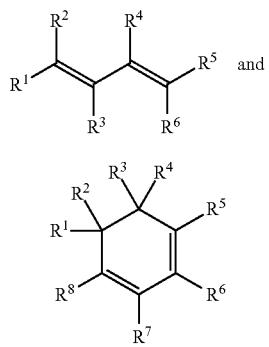

(5A)

(5B)

wherein
$R^1, R^2, R^3, R^4, R^5, R^6, R^7$ and $R^8$ are as defined for monomer units (1A), (1B), (1C) and (1D),
based on total mols of monomers used in the preparation of polymerblock B.

The anionic polymerisation methods are usually initiated by a mono-functional initiator such as n-BuLi or sec-BuLi, or a bi-functional initiator such as 1,4-dilithio-1,1,4,4-tetraphenylbutane.

The anionic polymerisation methods are usually performed in a suitable aprotic solvent or mixture of aprotic solvents. The aprotic solvent can be a polar solvent such as tetrahydrofuran or a non-polar solvent such as toluene or cyclohexane.

The weight ratio of total monomer/solvent is usually in the range of 1/100 to 40/100 (weight/weight), more preferably in the range of 5/10 to 30/100 (weight/weight).

The anionic polymerisations are usually performed at a temperature from 30 to 80° C., preferably 50 to 80° C.

The anionic polymerisations are usually terminated by addition of a protic solvent such as water or isopropanol.

Practical details of performing anionic polymerizations are described e.g. by Maurice Morton in "Anionic Polymerization: Principles and Practice", Academic Press, New York, 1983, and by Henry Hsieh, Roderic P. Quirk Anionic Polymerization: Principles and Practical Applications, Marcel Dekker, New York, 1996.

For example, polymerbock B can be prepared by ring-opening metathesis polymerisation (ROMP) using at least 60 mol % of monomers selected from the group consisting of

(5C)

and (5D)

(5E)

based on total mols of monomers used in the preparation of polymerblock B.

The ring-opening metathesis polymerisation methods are usually performed in the presence of a suitable catalyst such as Schrock catalyst or Grubbs' catalyst. The ring-opening metathesis polymerisation methods can be terminated by addition of an aldehyde.

Proper selection of the catalyst and performing ROMP can be taken from the "Handbook of Metathesis, Volume 1-3" by Robert H. Grubbs et at. 2015, Wiley-VCH, Weinheim, and Robert H. Grubbs in Handbook of Metathesis (Wiley-VCH, Weinheim, 2003).

If the star-shaped polymer is a triblock polymer consisting of one polymerblock A and two polymerblocks B, the following preparation methods may be used: "sequential addition of monomers", "bifunctional initiation" or "bifunctional coupling".

"Sequential addition of monomers" by anionic polymerisation can involve providing a mono-functional initiator, such as n-BuLi or sec-BuLi, followed by addition of the monomers for the first polymerblock B, followed by addition of the monomers for the polymerblock A, followed by addition of the monomers for the second polymerblock B, followed by termination with a protic solvent.

"Bifunctional initiation" by anionic polymerisation can involve providing a bifunctional initiator such as 1,4-dilithio-1,1,4,4-tetraphenylbutane, followed by addition of the monomers of polymerblock A, followed by addition of the monomers of polymerblocks B, followed by termination with a protic solvent. In the final polymer, the bifunctional initiator becomes part of polymerblock A.

"Bifunctional coupling" can involve coupling of polymerblock A carrying two terminal CH=O groups with polymerblock B prepared either by anionic polymerisation using a mono-functional initiator or by ring-opening metathesis polymerisation (ROMP).

"Bifunctional coupling" can also involve coupling of polymerblock A prepared by anionic polymerisation using a bifunctional initiator with polymerblock B carrying a CH=O group.

Polymerblock A canning two terminal CH=O groups can be prepared by anionic polymerisation using a bifunctional initiator, followed by termination with a reagent containing a group causing the termination and in addition an aldehyde group or protected aldehyde group, and, if a protected aldehyde group is present, deprotecting the protected aldehyde group.

Polymerblock B carrying a CH=O group can be prepared either by anionic polymerisation using a monofunctional initiator or by ring-opening metathesis polymerisation (ROMP), both followed by termination with a reagent containing a group causing the termination and in addition an aldehyde group or protected aldehyde group, and, if a protected aldehyde group is present, deprotecting the protected aldehyde group.

Examples of reagents containing a group causing the termination and in addition an aldehyde group are O=CH—(CH$_2$)$_2$—Cl, O=CH-phenylene-CH$_2$Cl and O=CH—CH$_2$—Si(Me)$_2$Cl.

Examples of reagents containing a group causing the termination and in addition a protected aldehyde group are O=CH—(CH$_2$)$_2$—C(OCH$_3$)$_2$ or O=CH-phenylene-C(OCH$_3$)$_2$. The protected aldehyde group can be deprotected by hydrolysis in the presence of acetic acid.

A comprehensive overview for making end-functionalized polymers by protected functionalized termination agents and initiators are given by A. Hirao and M. Hayashi in "Recent advance in syntheses and applications of well-defined endfunctionalized polymers by means of anionic living polymerization", Acta Polymerica 1999, Vol. 50, page 219 to 231.

If the polymer is a polymer consisting of one polymerblock A and more than two polymerblocks B, a so-called "star-shaped polymer", the following preparation methods may be used: "multifunctional initiation" or "multifunctional coupling".

For example, "multifunctional initiation" by anionic polymerisation can involve providing a multifunctional initiator, followed by addition of the monomers of polymerblock A, followed by addition of the monomers of polymerblocks B. In the final polymer, the multifunctional initiator becomes part of polymerblock A. If, for example, polymerblock A mainly contains mainly monomer units of formula (1A), the multifunctional initiator can be an oligomer obtained by polymerisation of divinylbenzene, diphenylethylene and styrene in the presence of a mono-functional initiator, usually a lithium organic compound such as n-BuLi or sec-BuLi.

For example, "Multifunctional coupling" by anionic polymerisation can involve providing a mono-functional initiator, usually a lithium organic compound such as n-BuLi or sec-BuLi, followed by addition of the monomers for the polymerblocks B, followed by addition of the monomers of polymerblock A, followed by addition of a multifunctional coupling agent such as 1,2-bis(trichlorosilyl)ethane.

Depending on the monomer units of polymerblock A and polymerblock B, a suitable preparation method can be chosen.

Preferably, the crosslinking agent carrying at least two azide groups is a crosslinking agent carrying two azide groups.

Preferably, the crosslinking agent carrying two azide groups is of formula

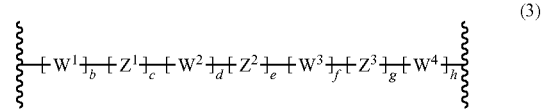
(2)

wherein
a is 0 or 1,
R$^{50}$ is at each occurrence selected from the group consisting of H, halogen, SO$_3$M and C$_{1-20}$-alkyl, which C$_{1-20}$-alkyl can be substituted with one or more halogen,
  wherein M is H, Na, K or Li, and
L$^{50}$ is a linking group.

Preferably, a is 0.

Preferably, R$^{50}$ is at each occurrence selected from the group consisting of F, SO$_3$M and C$_{1-20}$-alkyl, which C$_{1-20}$-alkyl can be substituted with one or more F,
wherein M is Na, K or Li.

More preferably, R$^{50}$ is at each occurrence F.

L$^{50}$ can be any suitable linking group.

Preferably, L$^{50}$ is a linking group of formula $$\xi\!-\!\!\left[\!W^1\!\right]_{\!b}\!\!\left[\!Z^1\!\right]_{\!c}\!\!\left[\!W^2\!\right]_{\!d}\!\!\left[\!Z^2\!\right]_{\!e}\!\!\left[\!W^3\!\right]_{\!f}\!\!\left[\!Z^3\!\right]_{\!g}\!\!\left[\!W^4\!\right]_{\!h}\!-\!\xi \qquad (3)$$

wherein
b, c, d, e, f, g and h are independently from each other 0 or 1, provided that b, c, d, e, f, g and h are not all at the same time 0,
W$^1$, W$^2$, W$^3$ and W$^4$ are independently selected from the group consisting of C(O), C(O)O, C(O)—NR$^{51}$, SO$_2$—NR$^{51}$, NR$^{51}$, N$^+$R$^{51}$R$^{51}$, CR$^{51}$=CR$^{51}$ and ethynylene
  wherein
    R$^{51}$ is at each occurrence H or C$_{1-10}$-alkyl, or two R$^{51}$ groups, which can be from different W$^1$, W$^2$, W$^3$ and W$^4$ groups, together with the connecting atoms form a 5, 6 or 7 membered ring, which may be substituted with one to three C$_{1-6}$-alkyls,
Z$^1$, Z$^2$ and Z$^3$ are independently selected from the group consisting of C$_{1-10}$-alkylene, C$_{5-8}$-cycloalkylene, C$_{6-14}$-arylene, 5 to 14 membered heteroarylene and a polycyclic system containing at least one ring selected from C$_{6-14}$-aromatic ring and 5 to 14 membered heteroaromatic ring,
  wherein
    C$_{1-10}$-alkylene, C$_{5-8}$-cycloalkylene, C$_{6-14}$ membered arylene, 5 to 14 membered heteroarylene and polycyclic system containing at least one ring selected from C$_{6-14}$-aromatic ring and 5 to 14 membered heteroaromatic ring can be substituted with one to five C$_{1-20}$-alkyl or phenyl.

Examples of linking groups L$^{50}$ are

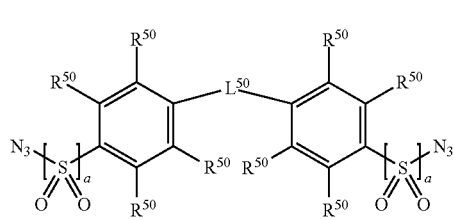

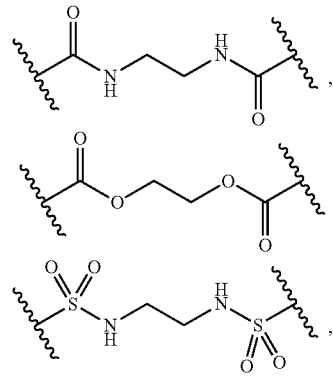

-continued

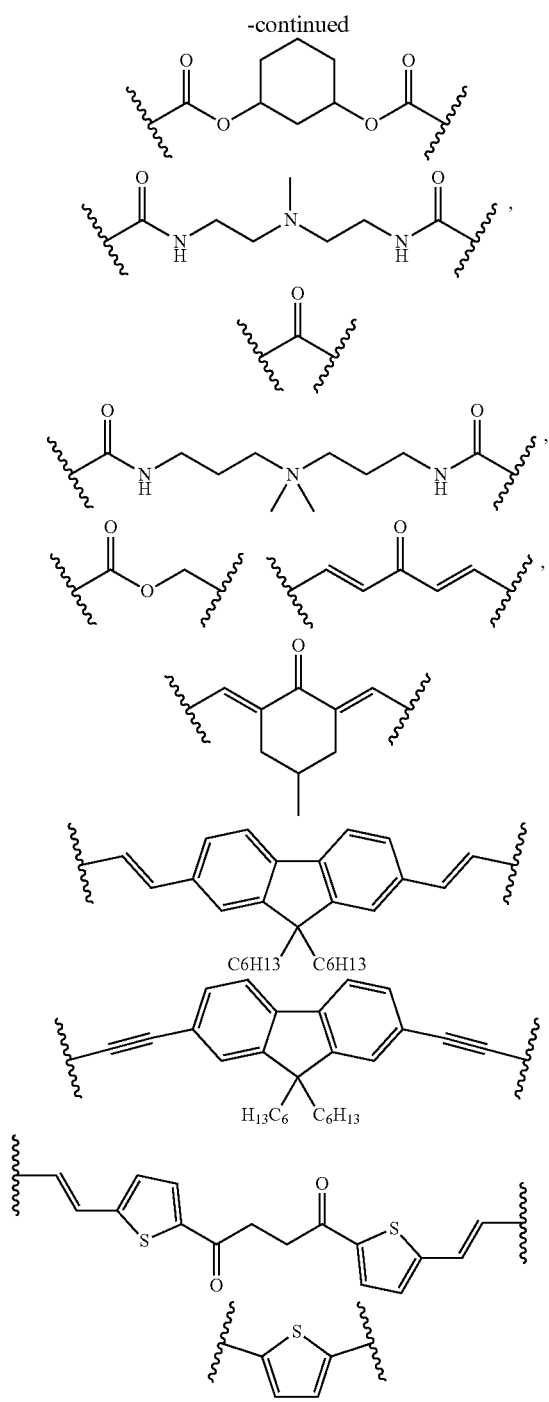

More preferably, $L^{50}$ is a linking group of formula

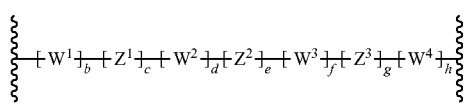

(3)

wherein
b, c, d, e, f, g and h are independently from each other 0 or 1, provided that at least one of c, e, and g is 1, $W^1$, $W^2$, $W^3$ and $W^4$ are independently from each other selected from the group consisting of C(O), C(O)O, C(O)—$NR^{51}$, $SO_2$—$NR^{51}$, $NR^{51}$, $N^+R^{51}R^{51}$, $CR^{51}$=$CR^{51}$ and ethynylene
wherein
$R^{51}$ is at each occurrence H or $C_{1-10}$-alkyl, or two $R^{51}$ groups, which can be from different $W^1$, $W^2$, $W^3$ and $W^4$ groups, together with the connecting atoms form a 5, 6 or 7 membered ring, which may be substituted with one to three $C_{1-6}$-alkyls,
$Z^1$, $Z^2$ and $Z^3$ are independently from each other selected from the group consisting of $C_{1-10}$-alkylene, $C_{5-8}$-cycloalkylene, $C_{6-14}$-arylene, 5 to 14 membered heteroarylene and polycyclic system containing at least one ring selected from $C_{6-14}$-aromatic ring and 5 to 14 membered heteroaromatic ring,
wherein
$C_{1-10}$-alkylene, $C_{5-8}$-cycloalkylene, $C_{6-14}$ membered arylene, 5 to 14 membered heteroarylene and polycyclic system containing at least one ring selected from $C_{6-14}$-aromatic ring and 5 to 14 membered heteroaromatic ring can be substituted with one to five $C_{1-20}$-alkyl or phenyl,
provided at least one of $Z^1$, $Z^2$ and $Z^3$ is $C_{6-14}$-arylene, 5 to 14 membered heteroarylene or polycyclic system containing at least one ring selected from $C_{6-14}$-aromatic ring and 5 to 14 membered heteroaromatic ring.

Most preferably, $L^{50}$ is a linking group of formula

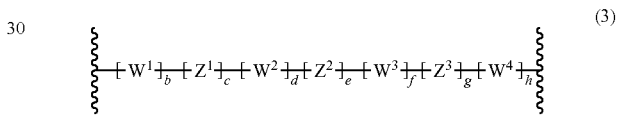

(3)

wherein
b, c, d, e, f, g and h are independently from each other 0 or 1, provided that at least one of c, e, and g is 1,
$W^1$, $W^2$, $W^3$ and $W^4$ are independently from each other selected from the group consisting of C(O), $CR^{51}$=$CR^{51}$ and ethynylene
wherein
$R^{51}$ is H,
$Z^1$, $Z^2$ and $Z^3$ are independently from each other selected from the group consisting of $C_{1-10}$-alkylene, $C_{6-14}$-arylene, 5 to 14 membered heteroarylene, and polycyclic system containing at least one ring selected from $C_{6-14}$-aromatic ring and 5 to 14 membered heteroaromatic ring,
wherein
$C_{1-10}$-alkylene, $C_{6-14}$ membered arylene, 5 to 14 membered heteroarylene and polycyclic system containing at least one ring selected from $C_{6-14}$-aromatic ring and 5 to 14 membered heteroaromatic ring can be substituted with one or two $C_{1-20}$-alkyl or phenyl,
provided at least one of $Z^1$, $Z^2$ and $Z^3$ is $C_{6-14}$-arylene, 5 to 14 membered heteroarylene or polycyclic system containing at least one ring selected from $C_{6-14}$-aromatic ring and 5 to 14 membered heteroaromatic ring.

In particular, $L^{50}$ is

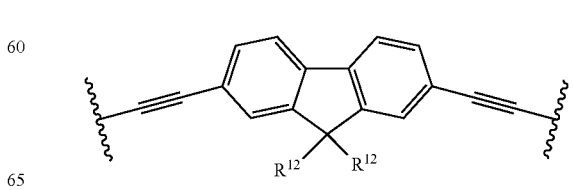

wherein $R^{12}$ is $C_{1-20}$-alkyl.

The preparation of crosslinking agents carrying at least two azide groups are described in various publications, for example WO 2015/004563, Cai, S. X.; Glenn, D. J.; Kanskar, M.; Wybourne, M. N.; Keana, J. F. W. Chem. Mater. 1994, 6, 1822-1829, Van, M.; Cai, S. X.; Wybourne, M. N.; Keana, J. F. W. J. Mater. Chem. 1996, 6, 1249-1252, Touwslager, F. J.; Willard, N. P.; Leeuw, D. M. Applied Physics Letters 2002, 81, 4556, WO 04/100282, WO 2007/004995, WO 2009/068884, Png, R.-Q.; Chia, P.-J.; Tang, J.-C.; Liu, B.; Sivaramakrishnan S.; Zhou, M.; Khong, S.-H.; Chan, H. S. O.; Burroughes, J. H.; Chua, L.-L.; Friend, R. H.; Ho, P. K. H. Nature Materials 2010, 9(2), 152-152, and WO 2011/068482.

The composition comprising the first dielectric material and a crosslinking agent carrying at least two azide groups can also comprise a solvent. The solvent can be any suitable solvent or solvent mixture. Preferably, the solvent is a polar aprotic solvent or mixture of polar aprotic solvents. Examples of polar aprotic solvents are ethyl acetate, butyl acetate, acetone, cyclopentanone, tetrahydrofuran, propylene glycol monomethyl ether acetate, acetonitrile, dimethylformamide and dimethylsulfoxide. Preferred polar aprotic solvents are butyl acetate, cyclopentanone and propylene glycol monomethyl ether acetate, in particular cyclopentanone and propylene glycol monomethyl ether acetate.

Preferably, the composition comprising a first dielectric material and a crosslinking agent carrying at least two azide groups is a solution and comprises
  i) 0.1 to 500 mg of the first dielectric material based on 1000 mg of the composition,
  ii) 0.1 to 20% by weight of the crosslinking agent carrying at least two azide groups based on the weight of the first dielectric material, and
  iii) a solvent.

More preferably, the composition comprising a first dielectric material and a crosslinking agent carrying at least two azide groups is a solution and comprises
  i) 0.1 to 250 mg of the first dielectric material based on 1000 mg of the composition,
  ii) 0.1 to 15% by weight of the crosslinking agent carrying at least two azide groups based on the weight of the first dielectric material, and
  iii) a solvent.

Most preferably, the composition comprising a first dielectric material and a crosslinking agent carrying at least two azide groups is a solution and comprises
  i) 10 to 100 mg of the first dielectric material based on 1000 mg of the composition,
  ii) 1 to 10% by weight of the crosslinking agent carrying at least two azide groups based on the weight of the first dielectric material, and
  iii) a solvent.

The composition comprising a first dielectric material and a crosslinking agent carrying at least two azide groups can be prepared by mixing the first dielectric material, the crosslinking agent carrying at least two azide groups, and optionally the solvent.

The organic semiconducting material can be any organic semiconducting material known in the art. The organic semiconducting material can be a small molecule or a polymer.

Examples of organic semiconducting materials are polycyclic aromatic hydrocarbons consisting of linearly-fused aromatic rings such as anthracene, pentacene and derivatives thereof, polycyclic aromatic hydrocarbons consisting of two-dimensional fused aromatic rings such as perylene, perylene diimide derivatives, perylene dianhydride derivatives and naphthalene diimide derivatives, triphenylamine derivatives, oligomers and polymers containing aromatic units such as oligothiophene, oligophenylenevinylene, polythiophene, polythienylenevinylene polyparaphenylene, polypyrrole and polyaniline, hydrocarbon chains such as polyacetylenes, and diketopyrrolopyrrole-based materials.

For example, bis-alkynyl substituted polycyclic aromatic hydrocarbons consisting of linearly-fused aromatic rings are described in WO2007/068618.

For example, perylene diimide derivatives, perylene dianhydride derivatives and naphthalene diimide derivatives are described in WO2007/074137, WO2007/093643, WO2009/024512, WO2009/147237, WO2012/095790, WO2012/117089, WO2012/152598, WO2014/033622, WO2014/174435 and WO2015/193808.

For example, polymers comprising thiophene units are described in WO2010/000669, polymers comprising benzothiadiazol-cyclopentadithiophene units are described in WO2010/000755, polymers comprising dithienobenzathienothiophene units are described in WO2011/067192, polymers comprising dithienophthalimide units are described in WO2013/004730, polymers comprising thienothiophene-2,5-dione units as described in WO2012/146506, and polymers comprising Isoindigo-based units are described in WO2009/053291.

For example, diketopyrrolopyrrole-based materials and their synthesis are described in WO2005/049695, WO2008/000664, WO2010/049321, WO2010/049323, WO2010/108873, WO2010/136352, WO2010/136353, WO2012/041849, WO2012/175530, WO2013/083506, WO2013/083507 and WO2013/150005.

A summary on diketopyrrolopyrrole (DPP) based polymers suitable as semiconducting material in organic field effect transistors are also given in Christian B. Nielsen, Mathieu Turbiez and Iain McCulloch, Advanced Materials 2013, 25, 1859 to 1880.

Preferably, the organic semiconducting material is at least one diketopyrrolopyrrole-based material.

Preferably, the diketopyrrolopyrrole-based material is
  i) a diketopyrrolopyrrole-based polymer comprising units of formula

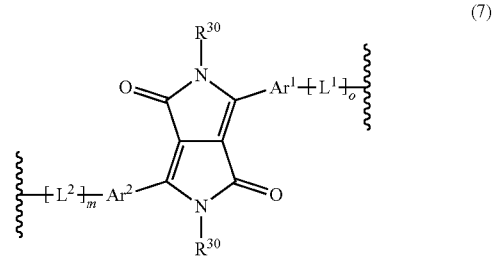

(7)

wherein
$R^{30}$ is at each occurrence $C_{1-30}$-alkyl, $C_{2-30}$-alkenyl or $C_{2-30}$-alkynyl, wherein $C_{1-30}$-alkyl, $C_{2-30}$-alkenyl and $C_{2-30}$-alkynyl can be substituted by one or more $—Si(R^b)_3$ or $—OSi(R^b)_3$, or one or more $CH_2$ groups of $C_{1-30}$-alkyl, $C_{2-30}$-alkenyl and $C_{2-30}$-alkynyl can be replaced by $—Si(R^b)_2—$ or $—[Si(R^b)_2—O]_a—Si(R^b)_2—$,
  wherein $R^b$ is at each occurrence $C_{1-10}$-alkyl, and a is an integer from 1 to 20,
o and m are independently 0 or 1, and
$Ar^1$ and $Ar^2$ are independently arylene or heteroarylene, wherein arylene and heteroarylene can be substituted with one or more $C_{1-30}$-alkyl, $C_{2-30}$-alkenyl, $C_{2-30}$-alkynyl, $O-C_{1-30}$ alkyl, aryl or heteroaryl, which $C_{1-30}$-alkyl, $C_{2-30}$-alkenyl, $C_{2-30}$-alkynyl, $O-C_{1-30}$ alkyl, aryl and heteroaryl can be substituted with one or more $C_{1-20}$-alkyl, $O-C_{1-20}$-alkyl or phenyl, $L^1$ and $L^2$ are independently selected from the group consisting of

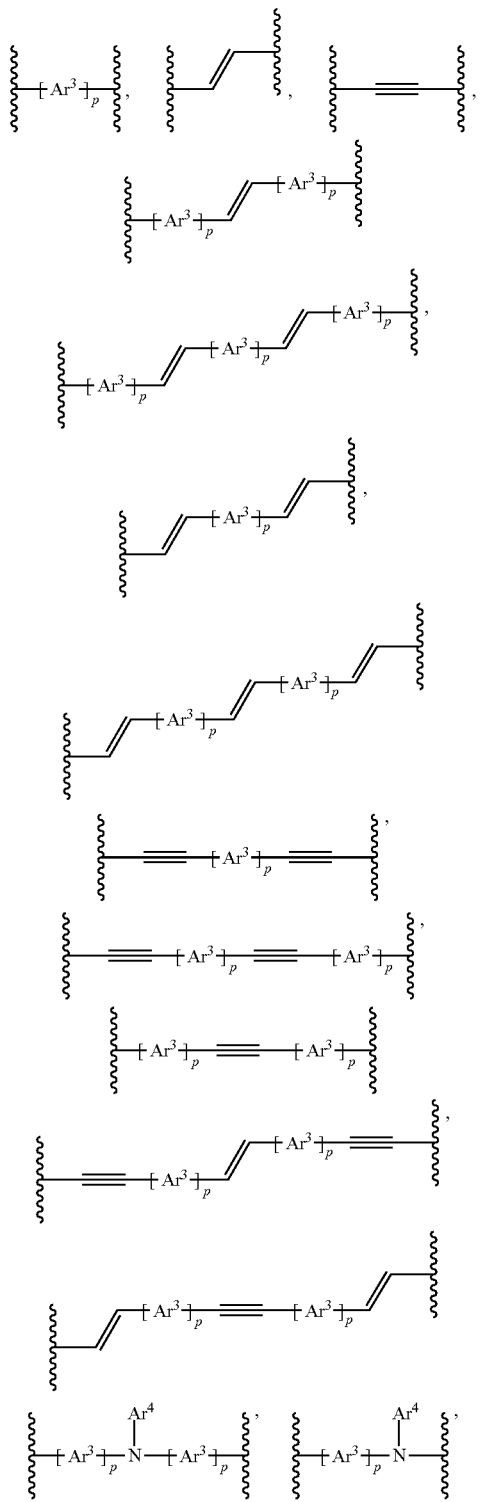

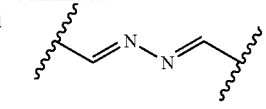

wherein $Ar^3$ is at each occurrence arylene or heteroarylene, wherein arylene and heteroarylene can be substituted with one or more $C_{1-30}$-alkyl, $C_{2-30}$-alkenyl, $C_{2-30}$-alkynyl, $O-C_{1-30}$-alkyl, aryl or heteroaryl, which $C_{1-30}$-alkyl, $C_{2-30}$-alkenyl, $C_{2-30}$-alkynyl, $O-C_{1-30}$-alkyl, aryl and heteroaryl can be substituted with one or more $C_{1-20}$-alkyl, $O-C_{1-20}$-alkyl or phenyl; and wherein adjacent $Ar^3$ can be connected via a $CR^cR^c$, $SiR^cR^c$ or $GeR^cR^c$ linker, wherein $R^c$ is at each occurrence H, $C_{1-30}$-alkyl or aryl, which $C_{1-30}$-alkyl and aryl can be substituted with one or more $C_{1-20}$-alkyl, $O-C_{1-20}$-alkyl or phenyl, p is at each occurrence an integer from 1 to 8, and $Ar^4$ is at each occurrence aryl or heteroaryl, wherein aryl and heteroaryl can be substituted with one or more $C_{1-30}$-alkyl, $O-C_{1-30}$ alkyl or phenyl, which phenyl can be substituted with $C_{1-20}$-alkyl or $O-C_{1-20}$-alkyl, or ii) a diketopyrrolopyrrole-based small molecule of formulae (8) or (9)

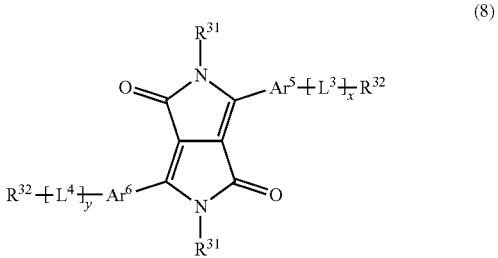

(8)

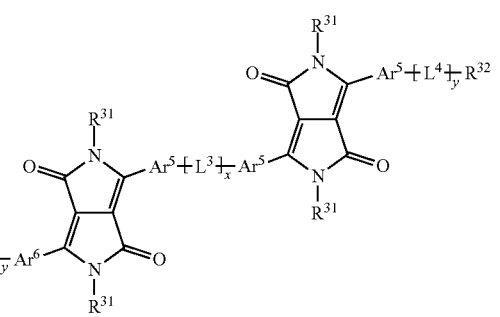

(9)

wherein $R^{31}$ is at each occurrence $C_{1-30}$-alkyl, $C_{2-30}$-alkenyl or $C_{2-30}$-alkynyl, wherein $C_{1-30}$-alkyl, $C_{2-30}$-alkenyl and $C_{2-30}$-alkynyl can be substituted by $-Si(R^d)_3$ or $-OSi(R^d)_3$, or one or more $CH_2$ groups of $C_{1-30}$-alkyl, $C_{2-30}$-alkenyl and $C_{2-30}$-alkynyl can be replaced by $-Si(R^d)_2-$ or $-[Si(R^d)_2-O]_a-Si(R^d)_2-$, wherein $R^d$ is at each occurrence $C_{1-10}$-alkyl, and a is an integer from 1 to 20, $R^{32}$ is H, CN, $C_{1-20}$-alkyl, $C_{2-20}$-alkenyl, $C_{2-20}$-alkynyl, $O-C_{1-20}$ alkyl, aryl or heteroaryl, which $C_{1-20}$-alkyl, $C_{2-20}$-alkenyl, $C_{2-20}$-alkynyl, $O-C_{1-20}$ alkyl, aryl and heteroaryl can be substituted with one or more $C_{1-6}$-alkyl, $O-C_{1-6}$-alkyl or phenyl, x and y are independently 0 or 1, and $Ar^5$ and $Ar^6$ are independently arylene or heteroarylene, wherein arylene and heteroarylene can be substituted with one or more $C_{1-30}$-alkyl, $C_{2-30}$-alkenyl, $C_{2-30}$-alkynyl, O—$C_{1-30}$-alkyl, aryl or heteroaryl, which $C_{1-30}$-alkyl, $C_{2-30}$-alkenyl, $C_{2-30}$-alkynyl, O—$C_{1-30}$-alkyl, aryl and heteroaryl can be substituted with one or more $C_{1-20}$-alkyl, O—$C_{1-20}$-alkyl or phenyl;

$L^3$ and $L^4$ are independently selected from the group consisting of

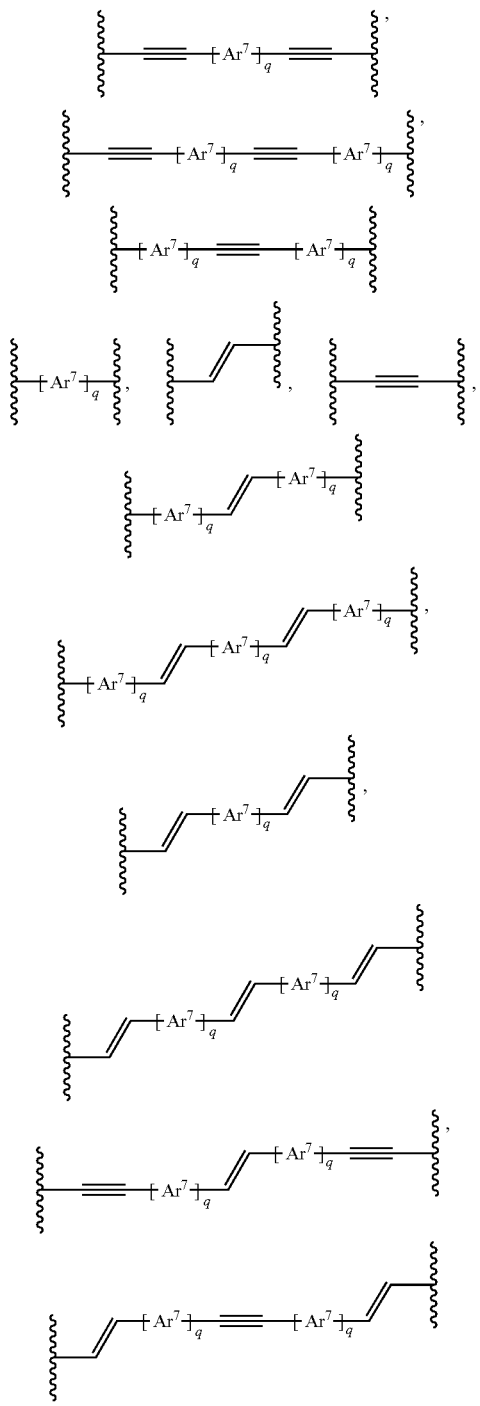

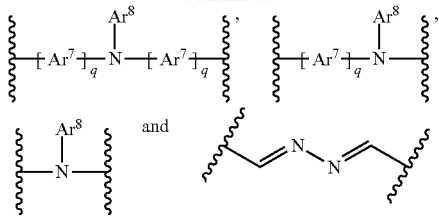

wherein $Ar^7$ is at each occurrence arylene or heteroarylene, wherein arylene and heteroarylene can be substituted with one or more $C_{1-30}$-alkyl, $C_{2-30}$-alkenyl, $C_{2-30}$-alkynyl, O—$C_{1-30}$-alkyl, aryl or heteroaryl, which $C_{1-30}$-alkyl, $C_{2-30}$-alkenyl, $C_{2-30}$-alkynyl, O—$C_{1-30}$-alkyl, aryl and heteroaryl can be substituted with one or more $C_{1-20}$-alkyl, O—$C_{1-20}$-alkyl or phenyl; and wherein adjacent $Ar^7$ can be connected via an $CR^eR^e$, $SiR^eR^e$ or $GeR^eR^e$ linker, wherein $R^e$ is at each occurrence H, $C_{1-30}$-alkyl or aryl, which $C_{1-30}$-alkyl and aryl can be substituted with one or more $C_{1-20}$-alkyl, O—$C_{1-20}$-alkyl or phenyl, q is at each occurrence an integer from 1 to 8, and $Ar^8$ is at each occurrence aryl or heteroaryl, wherein aryl and heteroaryl can be substituted with one or more $C_{1-30}$-alkyl, O—$C_{1-30}$-alkyl or phenyl, which phenyl can be substituted with $C_{1-20}$-alkyl or O—$C_{1-20}$-alkyl.

Examples of linear $C_{6-14}$-alkyl are n-hexyl, n-heptyl, n-octyl, n-nonyl, n-decyl, n-undecyl, n-dodecyl, n-undecyl, n-dodecyl, n-tridecyl and n-tetradecyl.

Examples of linear $C_{2-12}$-alkyl are ethyl, n-propyl, iso-propyl, n-butyl, n-pentyl, n-hexyl. n-heptyl, n-octyl, n-nonyl, n-decyl, n-undecyl and n-dodecyl.

$C_{2-30}$-alkenyl can be branched or unbranched. Examples of $C_{2-30}$-alkenyl are vinyl, propenyl, cis-2-butenyl, trans-2-butenyl, 3-butenyl, c/s-2-pentenyl, trans-2-pentenyl, c/s-3-pentenyl, trans-3-pentenyl, 4-pentenyl, 2-methyl-3-butenyl, hexenyl, heptenyl, octenyl, nonenyl, docenyl, linoleyl ($C_{18}$), linolenyl ($C_{18}$), oleyl ($C_{18}$), and arachidonyl ($C_{20}$), and erucyl ($C_{22}$).

$C_{2-30}$-alkynyl can be branched or unbranched. Examples of $C_{2-30}$-alkynyl are ethynyl, 2-propynyl, 2-butynyl, 3-butynyl, pentynyl, hexynyl, heptynyl, octynyl, nonynyl, decynyl, undecynyl, dodecynyl, undecynyl, dodecynyl, tridecynyl, tetradecynyl, pentadecynyl, hexadecynyl, heptadecynyl, octadecynyl, nonadecynyl and icosynyl ($C_{20}$).

Arylene is a bivalent aromatic ring system, consisting of one aromatic ring or of two to eight condensed aromatic rings, wherein all rings are formed from carbon atoms. Preferably, arylene is a bivalent aromatic ring system consisting of one aromatic ring or of two to four condensed aromatic rings, wherein all rings are formed from carbon atoms.

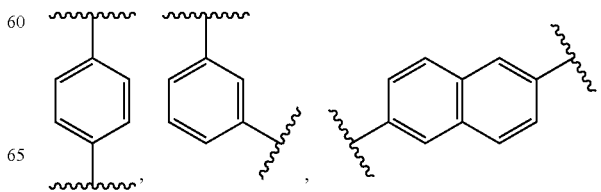

-continued

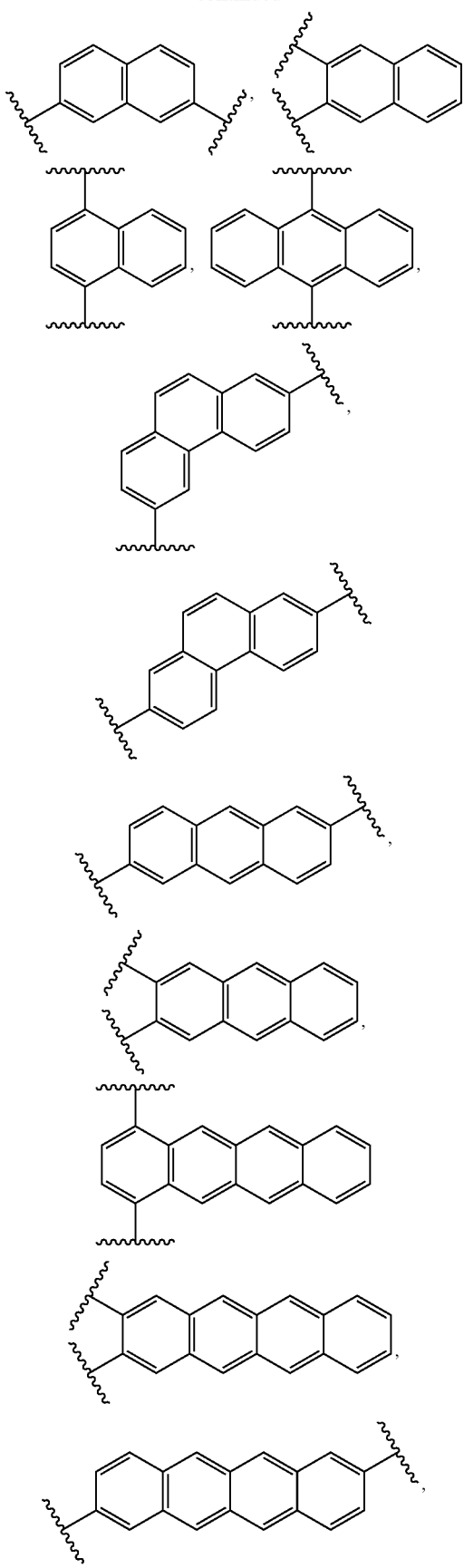

-continued

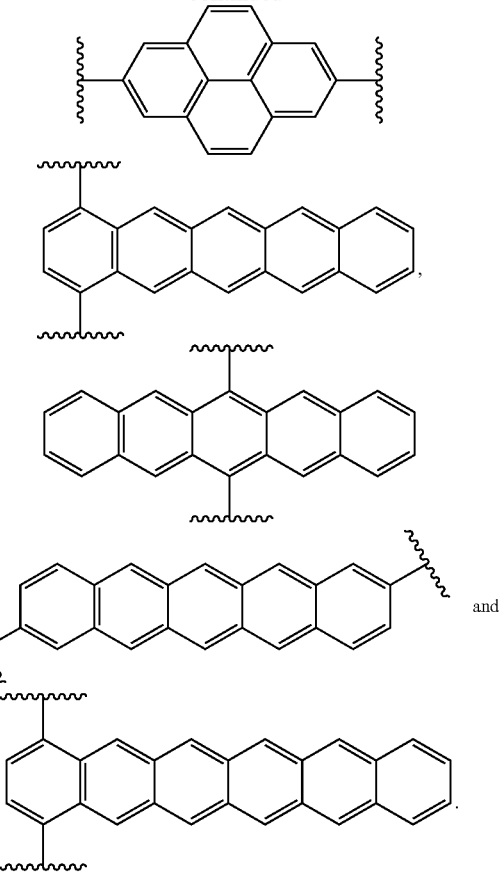

Heteroarylene is a bivalent aromatic ring system consisting of one aromatic ring or of two to eight condensed aromatic rings, wherein at least one aromatic ring contains at least one heteroatom selected from the group consisting of S, O, N and Se.

Preferably, heteroarylene is a bivalent aromatic ring system consisting of one aromatic ring or of two to four condensed aromatic rings, wherein at least one aromatic ring contains at least one heteroatom selected from the group consisting of S, O, N and Se.

Examples of heteroarylene are

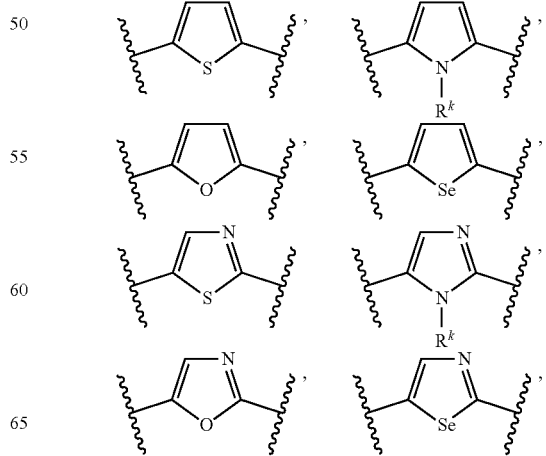

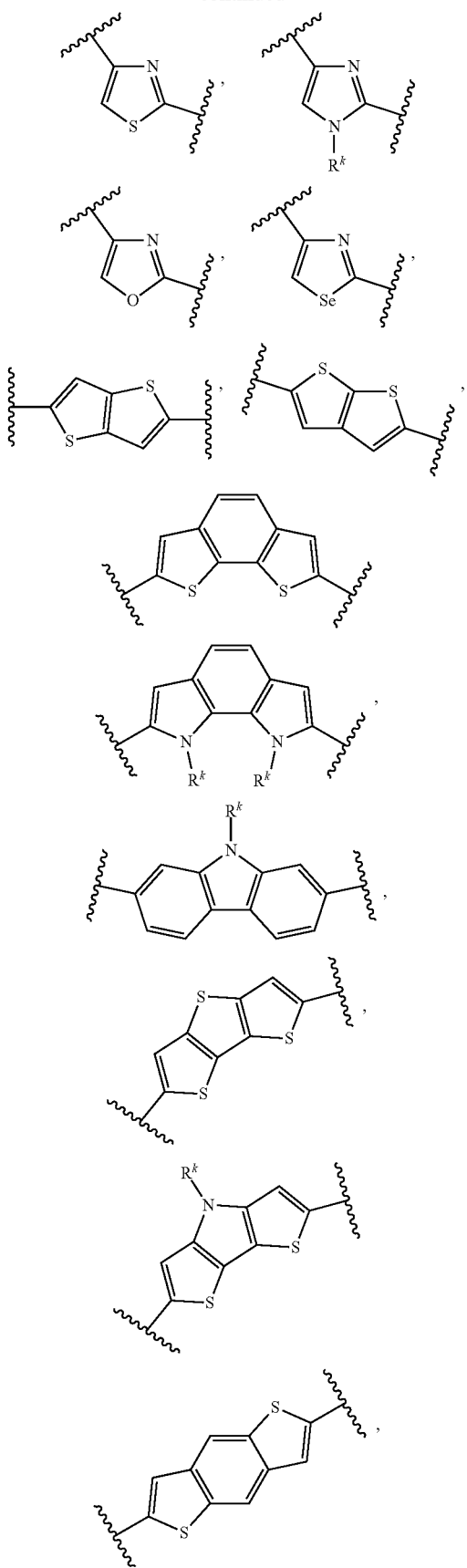
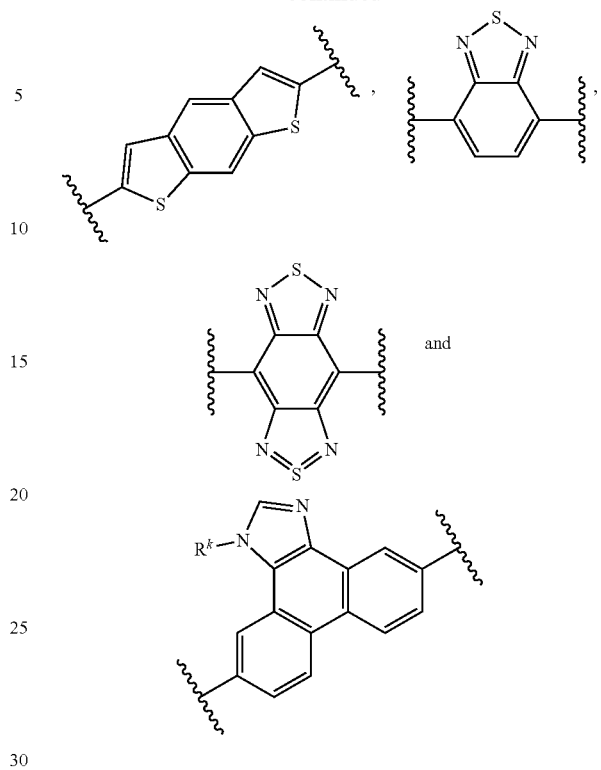

wherein $R^k$ is H, $C_{1-20}$-alkyl, aryl or heteroaryl, which $C_{1-20}$-alkyl, aryl and heteroaryl can be substituted with one or more $C_{1-6}$-alkyl, O—$C_{1-6}$-alkyl or phenyl.

Examples of adjacent $Ar^3$, which are connected via a $CR^cR^c$, $SiR^cR^c$ or $GeR^cR^c$ linker, wherein $R^c$ is at each occurrence H, $C_{1-30}$-alkyl or aryl, which $C_{1-30}$-alkyl and aryl can be substituted with one or more $C_{1-20}$-alkyl, O—$C_{1-20}$-alkyl or phenyl, and b is at each occurrence an integer from 1 to 8, are

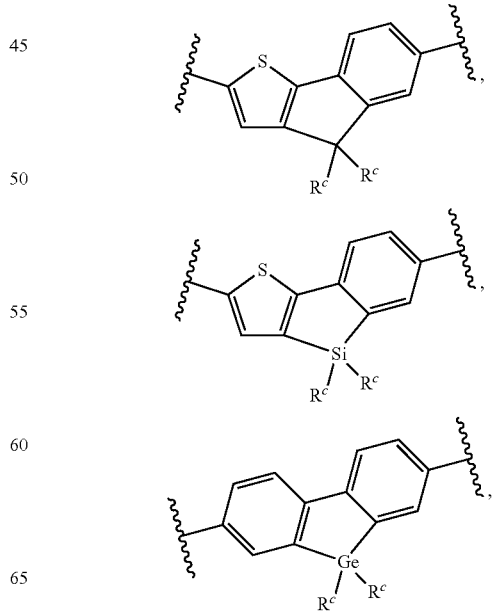

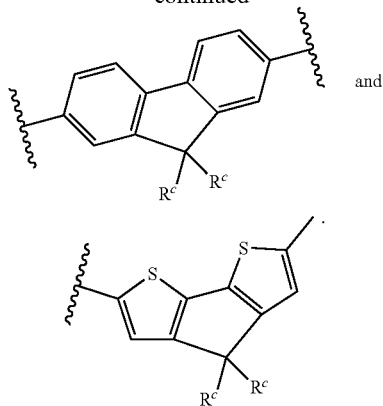

Examples of adjacent Ar⁷, which are connected via an CR$^e$R$^e$, SiR$^e$R$^e$ or GeR$^e$R$^e$ linker, wherein R$^e$ is at each occurrence H, $C_{1-30}$-alkyl or aryl, which $C_{1-30}$-alkyl and aryl can be substituted with one or more $C_{1-20}$-alkyl, O—$C_{1-20}$-alkyl or phenyl, and c is at each occurrence an integer from 1 to 8, are

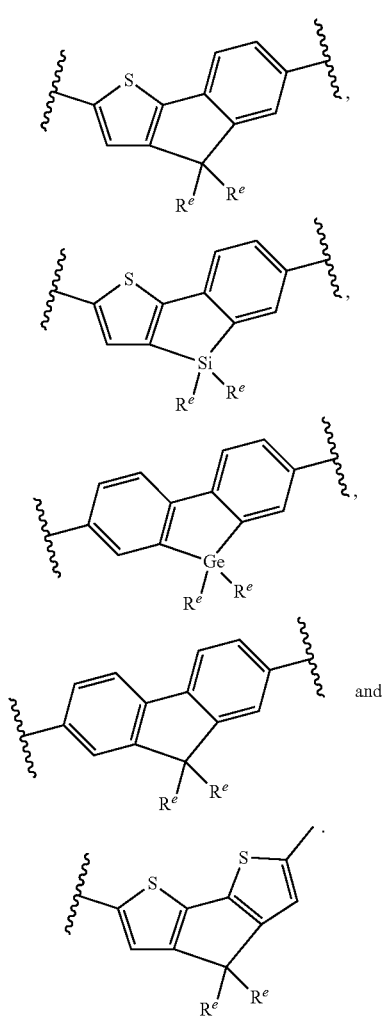

Aryl is a monovalent aromatic ring system, consisting of one aromatic ring or of two to eight condensed aromatic rings, wherein all rings are formed from carbon atoms. Preferably, aryl is a monovalent aromatic ring system consisting of one aromatic ring or of two to four condensed aromatic rings, wherein all rings are formed from carbon atoms.

Examples of aryl are

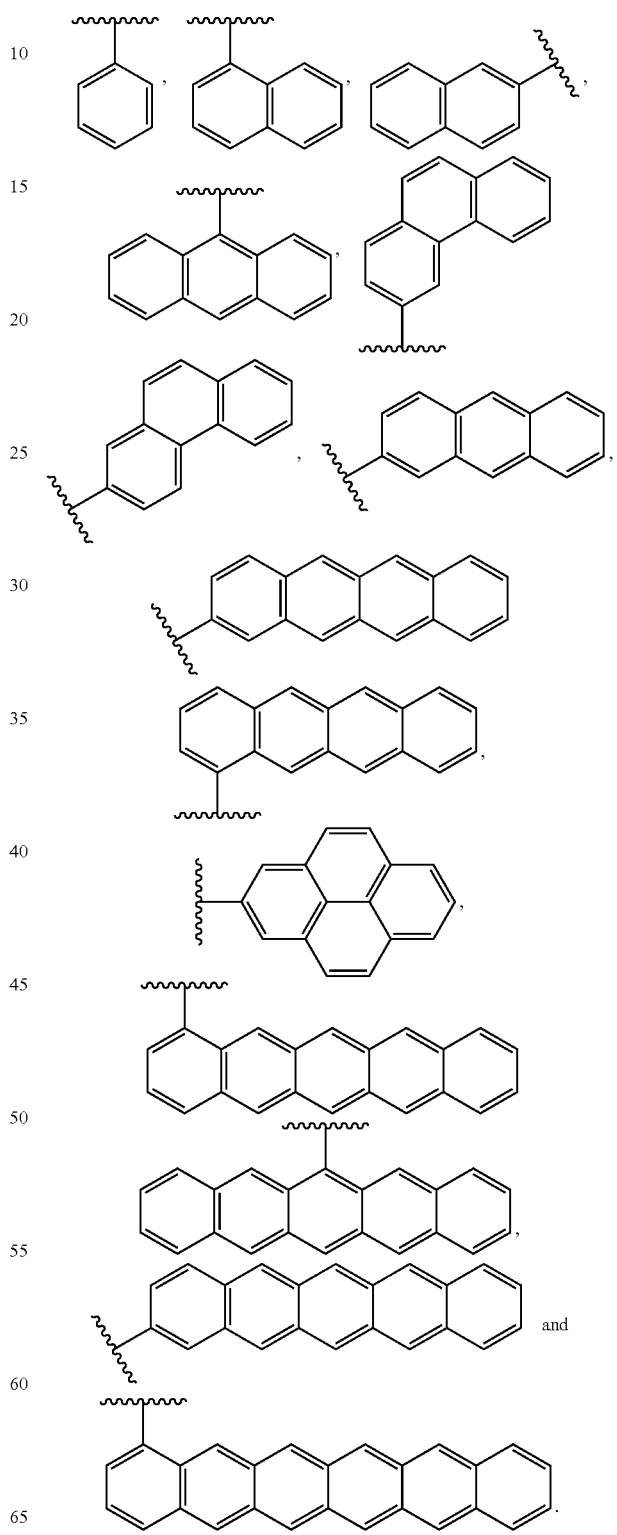

Heteroaryl is a monovalent aromatic ring system consisting of one aromatic ring or of two to eight condensed aromatic rings, wherein at least one aromatic ring contains at least one heteroatom selected from the group consisting of S, O, N and Se. Preferably, heteroaryl is a monovalent aromatic ring system consisting of one aromatic ring or of two to four condensed aromatic rings, wherein at least one aromatic ring contains at least one heteroatom selected from the group consisting of S, O, N and Se.

Examples of heteroaryl are

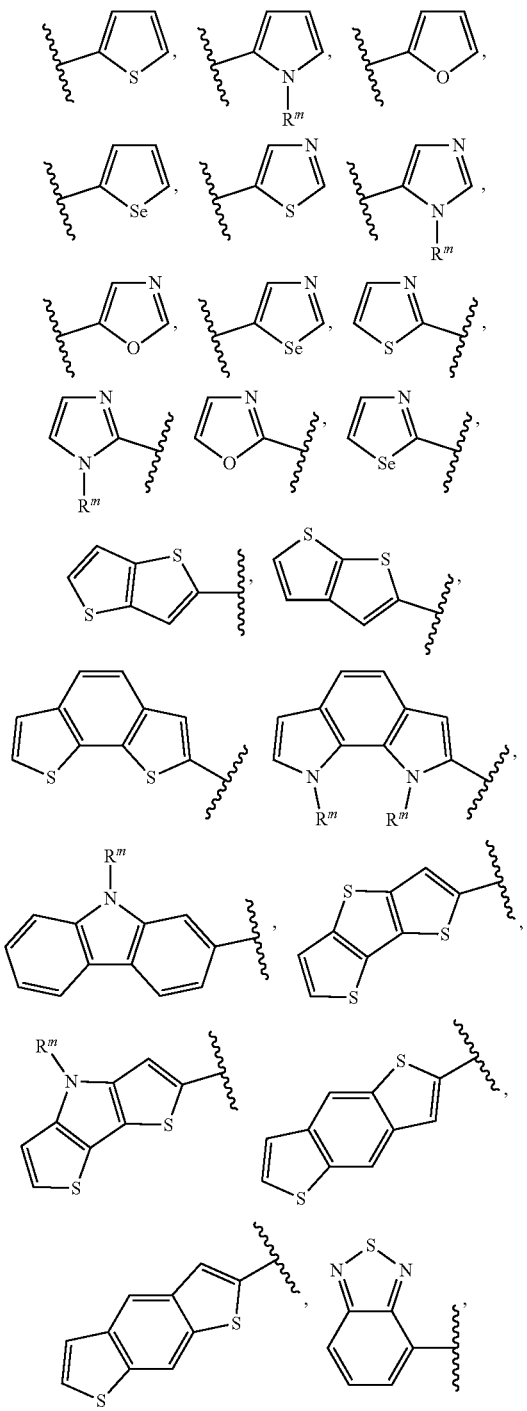

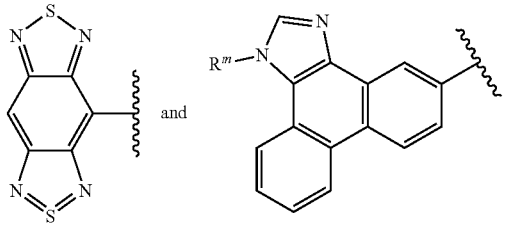

wherein $R^m$ is H, $C_{1-20}$-alkyl, aryl or heteroaryl, which $C_{1-20}$-alkyl, aryl and heteroaryl can be substituted with one or more $C_{1-6}$-alkyl, O—$C_{1-6}$-alkyl or phenyl.

Examples of $L^1$, $L^2$, $L^3$ and $L^4$ are

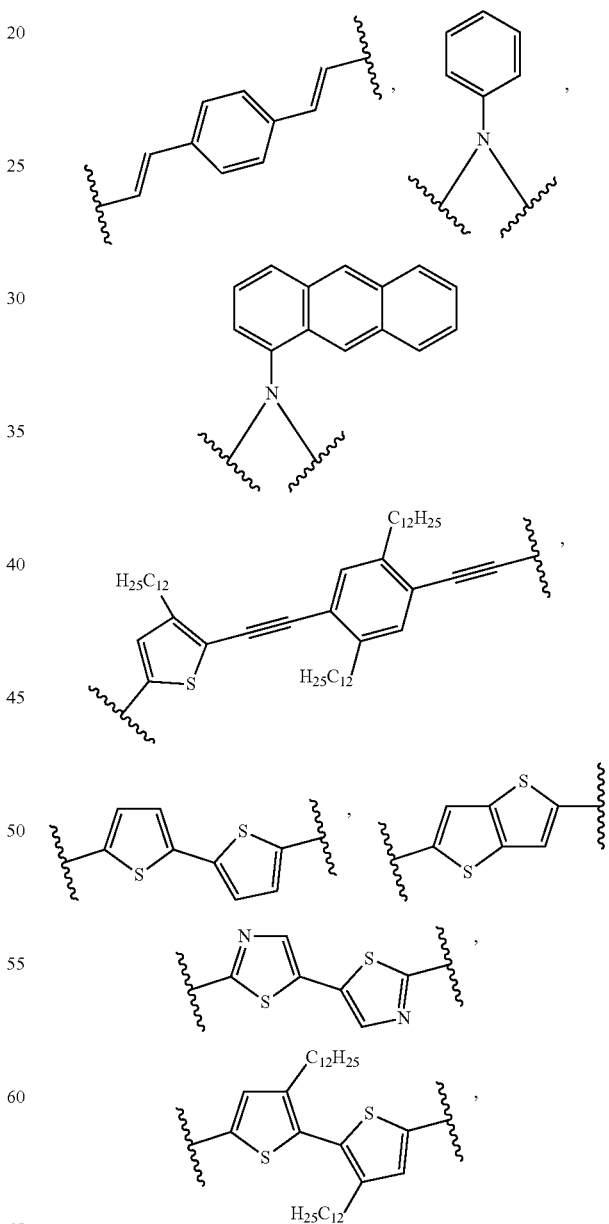

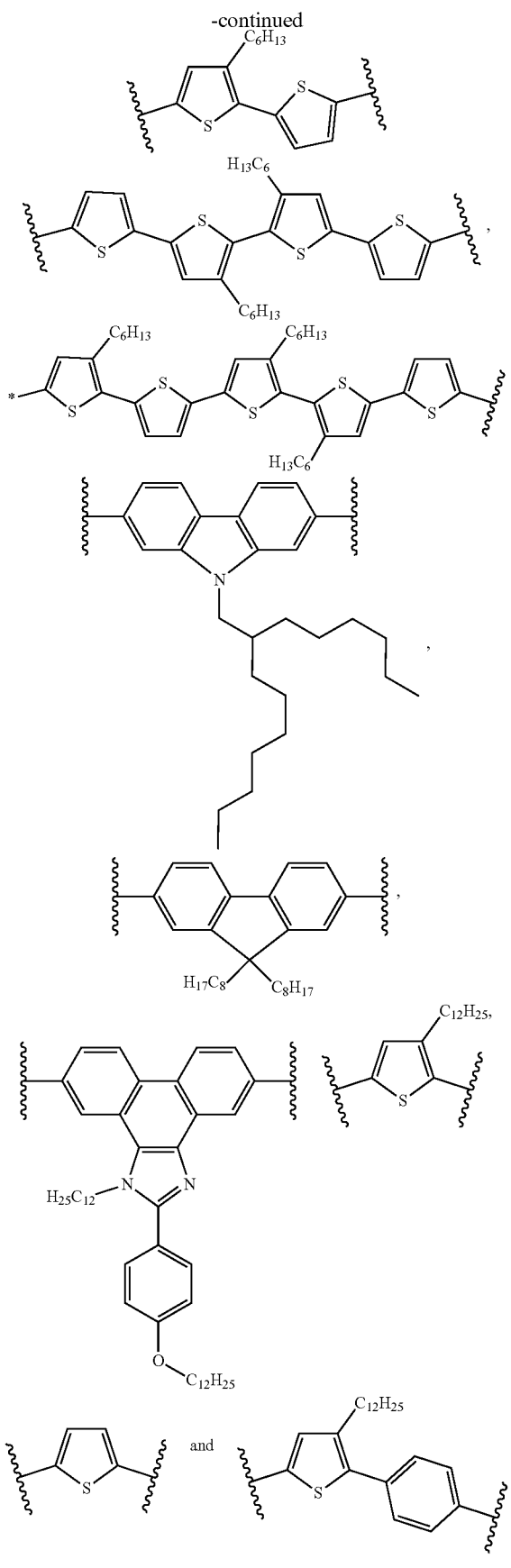

More preferably, the diketopyrrolopyrrole-based material is a diketopyrrolopyrrole-based polymer comprising units of formula (7) as defined above.

The diketopyrrolopyrrole-based polymers comprising units of formula (7) can comprise other conjugated units. The diketopyrrolopyrrole-based polymers comprising units of formula (7) can be homopolymers or copolymers. The copolymers can be random or block.

Preferably, the diketopyrrolopyrrole-based polymers comprise at least 50% by weight of units of formula (7) based on the weight of the polymer, more preferably at least 70%, even more preferably at least 90% by weight of units of formula (7) based on the weight of the polymer. Most preferably, diketopyrrolopyrrole-based polymers essentially consist of units of formula (7). The diketopyrrolopyrrole-based polymers essentially consisting of units of formula (7) can be homopolymers or copolymers.

Even more preferably, the diketopyrrolopyrrole-based material is a diketopyrrolopyrrole-based polymer essentially consisting of units of formula

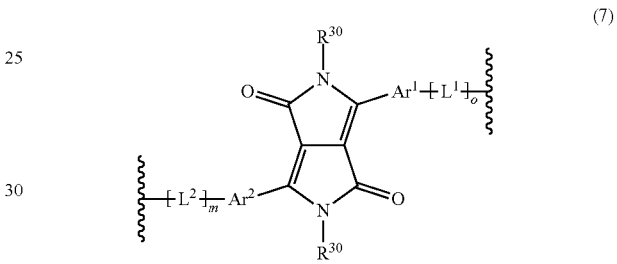

(7)

wherein
$R^{30}$ is $C_{6-30}$-alkyl,
o and m are independently 0 or 1, provided n and m are not both 0, and
$Ar^1$ and $Ar^2$ are independently

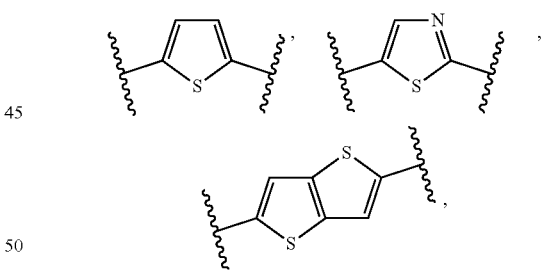

$L^1$ and $L^2$ are independently selected from the group consisting of

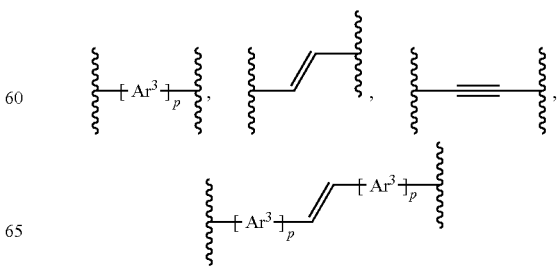

-continued

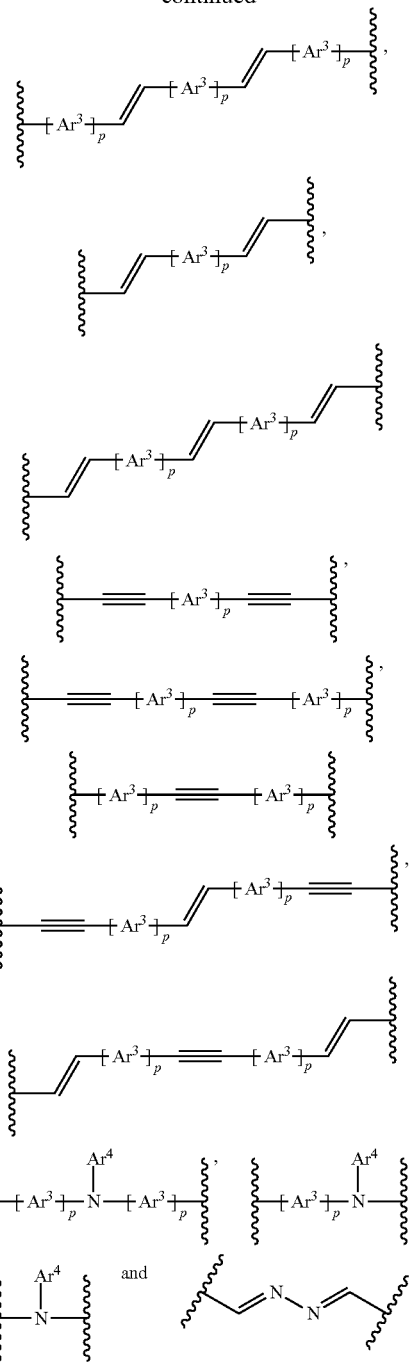

wherein
Ar³ is at each occurrence arylene or heteroarylene, wherein arylene and heteroarylene can be substituted with one or more $C_{1-30}$-alkyl, $C_{2-30}$-alkenyl, $C_{2-30}$-alkynyl, O—$C_{1-30}$-alkyl, aryl or heteroaryl, which $C_{1-30}$-alkyl, $C_{2-30}$-alkenyl, $C_{2-30}$-alkynyl, O—$C_{1-30}$-alkyl, aryl and heteroaryl can be substituted with one or more $C_{1-20}$-alkyl, O—$C_{1-20}$-alkyl or phenyl; and wherein adjacent Ar³ can be connected via a $CR^cR^c$, $SiR^cR^c$ or $GeR^cR^c$ linker, wherein $R^c$ is at each occurrence H, $C_{1-30}$-alkyl or aryl, which $C_{1-30}$-alkyl and aryl can be substituted with one or more $C_{1-20}$-alkyl, O—$C_{1-20}$-alkyl or phenyl, p is at each occurrence an integer from 1 to 8, and
Ar⁴ is at each occurrence aryl or heteroaryl, wherein aryl and heteroaryl can be substituted with one or more $C_{1-30}$-alkyl, O—$C_{1-30}$-alkyl or phenyl, which phenyl can be substituted with $C_{1-20}$-alkyl or O—$C_{1-20}$-alkyl.

Most preferably, the diketopyrrolopyrrole-based material is a diketopyrrolopyrrole-based polymer essentially consisting of units of formula

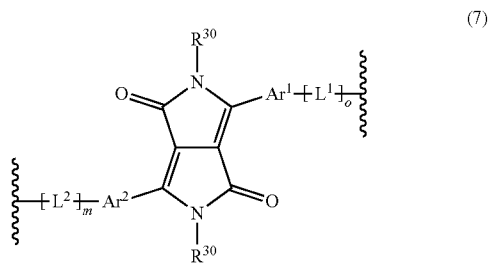

(7)

wherein
$R^{30}$ is

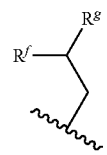

wherein
$R^f$ is linear $C_{6-14}$-alkyl, and
$R^g$ is linear $C_{2-12}$-alkyl,
o and m are independently 0 or 1, provided n and m are not both 0, and
Ar¹ and Ar² are

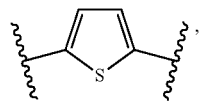 [SMILES: *c1ccc(*)s1]

$L^1$ and $L^2$ are independently selected from the group consisting of

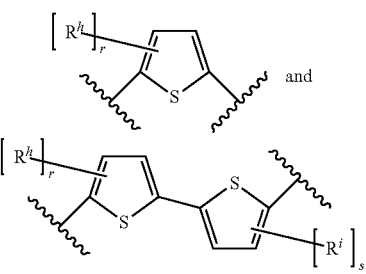

wherein
$R^h$ and $R^i$ are independently $C_{6-30}$-alkyl, and
r and s are independently 0 or 1.

In particular, the diketopyrrolopyrrole-based material is a diketopyrrolopyrrole-based copolymer essentially consisting of units of formulae

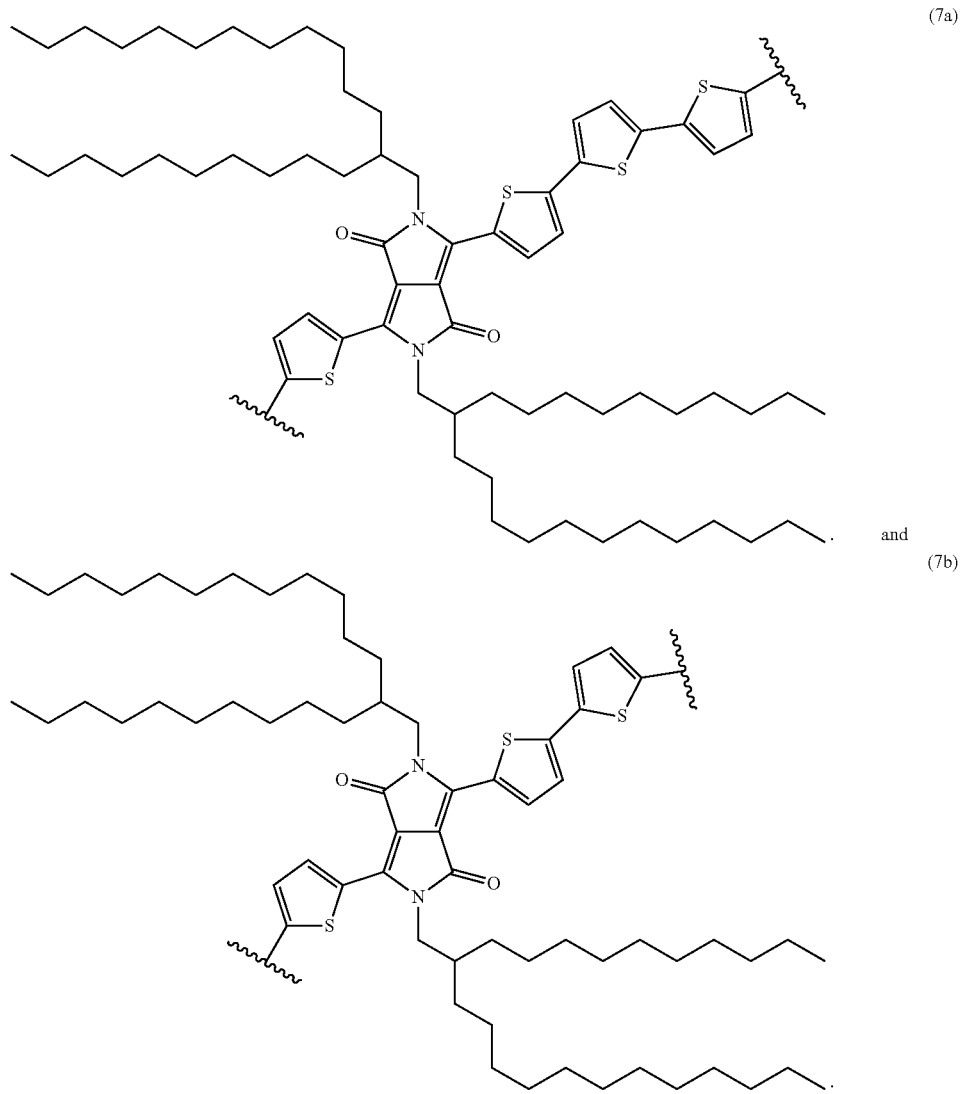

The composition comprising an organic semiconducting material can also comprise a solvent. The solvent can be any suitable solvent or solvent mixture. Preferably, the solvent is a nonpolar aprotic solvent or mixture of nonpolar aprotic solvents. Examples of nonpolar aprotic solvents are toluene, xylene and mesitylene.

Preferably, the composition comprising an organic semiconducting material also comprises a solvent and comprises from 0.01 to 10% by weight of the organic semiconducting material based on the weight of the composition. More preferably, the composition comprising an organic semiconducting material is a solution and comprises from 0.1 to 5% by weight of the organic semiconducting material based on the composition.

The substrate for the top-gate, bottom-contact organic field effect transistor can be any suitable substrate such as glass, or a plastic substrate such as silicon, polyethersulfone, polycarbonate, polysulfone, polyethylene terephthalate (PET) and polyethylene naphthalate (PEN).

The source and drain electrodes can be applied to the substrate by any suitable technique such as sputtering, and patterned for example by a lithography. The source and drain electrodes can be made from any suitable material. Examples of suitable materials are gold (Au), silver (Ag), chromium (Cr) or copper (Cu), as well as alloys comprising at least one of these metals. The source and drain electrodes can have a thickness of 1 to 100 nm, preferably from 20 to 70 nm.

The channel length (L) of the organic field effect transistor, which is the distance between source and drain electrode, is typically in the range of 5 to 100 μm.

The composition comprising the organic semiconducting material can be applied on top of the source/drain electrodes by techniques known in the art. Preferably, the composition comprising the organic semiconducting layer is applied by liquid processing techniques such as spin coating, blading, slot-die coating, drop-casting, spray-coating, ink-jetting or soaking of the substrate of the electronic device in the composition. Preferably, the composition comprising the organic semiconducting layer is applied by spin-coating.

The semiconducting layer can be treated with heat at a temperature from 40 to 120° C., preferably at a temperature from 70 to 100° C.

The semiconducting layer can have a thickness of 5 to 500 nm, preferably of 10 to 100 nm.

The composition comprising the first dielectric material and a crosslinking agent carrying at least two azide groups can be applied on top of semiconducting layer by techniques known in the art. Preferably, the composition comprising the first dielectric material and a crosslinking agent carrying at least two azide groups is applied by liquid processing techniques such as spin coating, blading, slot-die coating, drop-casting, spray-coating, ink-jetting or soaking of the substrate of the electronic device in the composition. Preferably, the composition comprising the first dielectric material and a crosslinking agent carrying at least two azide groups is applied by spin-coating.

The first dielectric layer can be treated with heat at a temperature from 40 to 120° C., preferably at a temperature of from 70 to 100° C.

The first dielectric layer has a thickness of 10 to 2000 nm, preferably of 50 to 1000 nm, more preferably of 100 to 500 nm.

Portions of the first dielectric layer can be cured by light treatment using a mask.

The light treatment is preferably performed at a low dosage such as at 5 to 300 mJ/cm$^2$, more preferably at 20 to 150 mJ/cm$^2$, most preferably 50 to 100 mJ/cm$^2$. Preferably, the light treatment is performed under ambient conditions. Ambient conditions refer to regular air, humidity and temperature conditions. Preferably, the light treatment is UV light treatment and more preferably UV light treatment at a wavelength of 365 nm.

The uncured portion of the first dielectric layer can be removed for example by treatment with a suitable solvent such as propylene glycol methyl ether acetate (PGMEA), which is also called wet-etching.

After the solvent treatment, the precursor of the top gate organic field effect transistor can be dried by blowing with nitrogen and heating at elevated temperatures, for example at a temperature in the range of from 70 to 100° C.

The portions of the semiconducting layer, that are not covered by the cured first dielectric layer, can be removed for example by etching out using oxygen plasma treatment (100 sccm, 40W, 2 minutes).

The channel length (L) of the organic field effect transistor is typically in the range of 3 to 2000 μm, preferably 3 to 20 μm.

The ration width (W)/length(L) of the organic field effect transistor is usually between 3/1 to 10/1.

Optionally a composition comprising a second dielectric material can be applied on top of the first dielectric layer forming a second dielectric layer. The composition comprising the second dielectric layer can be applied by techniques known in the art. Preferably, the composition comprising the second dielectric material is applied by liquid processing techniques such as spin coating, blading, slot-die coating, drop-casting, spray-coating, ink-jetting or soaking of the substrate of the electronic device in the composition. Preferably, the composition comprising the second dielectric material is applied by spin-coating.

The second dielectric layer can be treated with heat at a temperature from 40 to 120° C., preferably at a temperature of from 70 to 100° C. The second dielectric layer has a thickness of 10 to 2000 nm, preferably of 50 to 1000 nm, more preferably of 100 to 500 nm.

The second dielectric material can be any dielectric material known in the art or mixtures thereof. The dielectric material can be polystyrene (PS) and polystyrene derived polymers, poly(methylmethacrylate) (PMMA), poly(4-vinylphenol) (PVP), poly(vinyl alcohol) (PVA), benzocyclobutene (BCB) or polyimide (PI), or a star-shaped polymer as defined above. Preferably, the second dielectric material is polystyrene, a polystyrene-derived polymer or a star-shaped polymer as defined above. More preferably, the second dielectric material is a star-shaped polymer as defined above. If the second dielectric material is a star-shaped polymer as defined above, it is preferred that the composition comprising a second dielectric material also comprises a second crosslinking agent carrying at least two azide groups and a solvent. The definitions given for the crosslinking agent carrying at least two azide groups and the solvent of the composition comprising the first dielectric material also apply to the second crosslinking agent carrying at least two azide groups and the solvent of the composition comprising the second dielectric material.

If the second dielectric layer is formed from a composition comprising a second dielectric material and a second crosslinking agent carrying at least two azide groups, the second dielectric layer can also be cured by light treatment.

The light treatment of the second dielectric layer is preferably performed at a low dosage such as at 5 to 300 mJ/cm$^2$, more preferably at 20 to 150 mJ/cm$^2$, most preferably 50 to 100 mJ/cm$^2$. Preferably, the light treatment is performed under ambient conditions. Ambient conditions refer to regular air, humidity and temperature conditions. Preferably, the light treatment is UV light treatment and more preferably UV light treatment at a wavelength of 365 nm.

A gate electrode can be applied on top of the first dielectric layer or, if present, on top of the second dielectric layer, for example by evaporation using a mask. The gate electrode can be made from any suitable gate material such as highly doped silicon, aluminium (Al), tungsten (W), indium tin oxide or gold (Au), or alloys comprising at least one of these metals. The gate electrode can have a thickness of 1 to 200 nm, preferably from 5 to 100 nm.

In the embodiment where a second dielectric layer is formed on top of the first dielectric layer, it is preferred that the step of curing portions of the first dielectric layer by light treatment is performed in a way that the cured first dielectric layer covers the path between the source and drain electrodes and optionally also partially or completely covers the source and drain electrodes. It is more preferred that the cured first dielectric layer covers the path between the source and drain electrodes and partially covers the source and drain electrodes. As the cured first dielectric layer also functions as a "resist" to pattern the semiconducting layer, it is also preferred that the cured first dielectric layer and the semiconducting layer cover the path between the source and drain electrodes, and optionally also partially or completely covers the source and drain electrodes. It is more preferred that the cured first dielectric layer and the semiconducting layer cover the path between the source and drain electrodes and partially cover the source and drain electrodes. In this preferred embodiment, the cured first dielectric layer and the semiconducting layer do not extend beyond the source and drain electrodes.

In the embodiment where a second dielectric layer is formed on top of the cured first dielectric layer, it is also preferred that the composition comprising a second dielectric material is applied on top of the cured first dielectric layer in a way that the cured first dielectric layer and the semiconducting layer are embedded in the second dielectric layer.

Also part of the present invention is a top-gate, bottom-contact organic field effect transistor on a substrate, which organic field effect transistor comprises source and drain electrodes, a semiconducting layer, a cured first dielectric layer, a second dielectric layer and a gate electrode, wherein i) the cured first dielectric layer and the semiconducting layer cover the path between the source and drain electrodes and optionally also partially or completely cover the source and drain electrodes, and ii) the cured first dielectric layer and the semiconducting layer are embedded in the second dielectric layer.

Preferred are top-gate, bottom-contact organic field effect transistor on a substrate, wherein the cured first dielectric layer is obtained by i) applying a composition comprising a first dielectric material and a crosslinking agent carrying a least two azide groups in order to form a first dielectric layer, and ii) by curing portions of the first dielectric layer by light treatment in order to form a cured first dielectric layer, wherein the first dielectric material comprises a star-shaped polymer consisting of at least one polymer block A and at least two polymer blocks B, wherein each polymer block B is attached to the polymer block A, and wherein at least 60 mol % of the repeat units of polymer block B are selected from the group consisting of

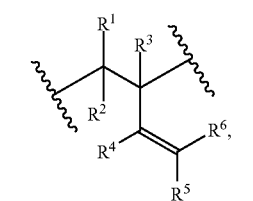

(1A)

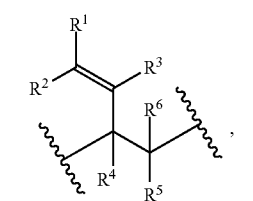

(1B)

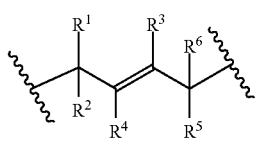

(1C)

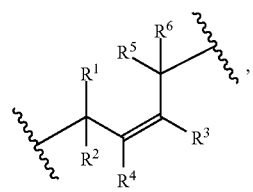

(1D)

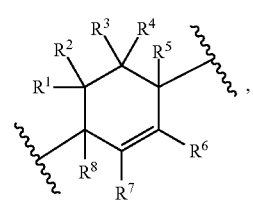

(1E)

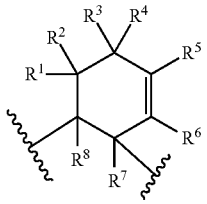

(1F)

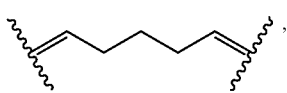

(1G)

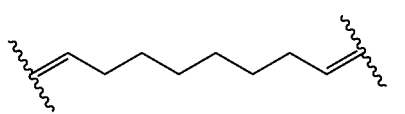

(1H)

and

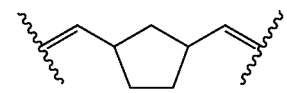

(1I)

wherein $R^1$, $R^2$, $R^3$, $R^4$, $R^5$, $R^6$, $R^7$ and $R^8$ are independently and at each occurrence H or $C_1$-$C_{10}$-alkyl.

More preferred are top-gate, bottom-contact organic field effect transistors on a substrate, wherein the cured first dielectric layer and the semiconducting layer cover the path between the source and drain electrodes and partially cover the source and drain electrodes.

The process for the preparation of a top-gate, bottom-contact organic field effect transistor on a substrate of the present invention is advantageous as it allows the preparation of a cured first dielectric layer of high film retention at low-dosage UV light treatment (5 to 300 mJ/m$^2$) under ambient conditions. Ambient conditions refer to ambient air, humidity and temperature conditions. Thus, the first dielectric layer does not require inert gas atmosphere in order to be cured at low-dosage UV radiation.

The film retention of the cured first dielectric layer refers to the ratio d2/d1, wherein d1 is the thickness of the cured dielectric layer before washing (development) and d2 is the thickness of the cured dielectric layer after washing (development).

The cured first dielectric layer is highly stable towards solvent dissolution. Thus, the next layer, for example an electrode material layer or another dielectric layer, can be applied without dissolving the cured first dielectric layer.

Depending on the crosslinking agent carrying at least two azide groups used, UV light treatment of 365 nm can be used.

The process for the preparation of a top-gate, bottom-contact organic field effect transistor on a substrate of the present invention is advantageous as it yields transistors of improved performance, wherein the semiconducting layer and the first dielectric layer are patterned together using low dosage UV light treatment under ambient conditions. The top gate organic field effect transistor shows improved performance such as high charge carrier mobility, low gate leakage current and/or high Ion/Ioff ratio.

The semiconducting layer can be formed from a composition comprising an organic semiconducting material by solution processing techniques, and the first dielectric layer can also be formed from a composition comprising a first dielectric layer and a crosslinking agent carrying at least two azide groups by solution processing techniques. Thus, the process for preparation of top gate organic field effect transistor on a substrate of the present invention is suitable for large-scale production of transistors on flexible substrates.

The top-gate, bottom-contact organic field effect transistor of the present invention is advantageous as it shows a low gate leakage current.

FIG. 1 shows an exemplary process for the preparation of a top gate organic field effect transistor of the present invention. In step 1 the source and drain electrodes are applied to the substrate. In step 2 the composition comprising an organic semiconducting material is applied in order to form an organic semiconducting layer. In step 3 the composition comprising the first dielectric material and the crosslinking agent carrying at least two azide groups is applied in order to form a first dielectric layer. In Step 4, portions of the first dielectric layer ($1^{st}$ GI) are treated with light in order to form a cured first dielectric layer. In step 5 uncured portions of the first dielectric layer are removed. In step 6, the portions of the organic semiconducting layer not covered by the cured first dielectric layer are removed. In step 7 a second dielectric layer ($2^{nd}$ GI) is applied in a way that the first dielectric layer and the organic semiconducting layer are embedded in the second dielectric layer. In step 8, a gate electrode is applied on top of the second dielectric layer.

Figure 1:
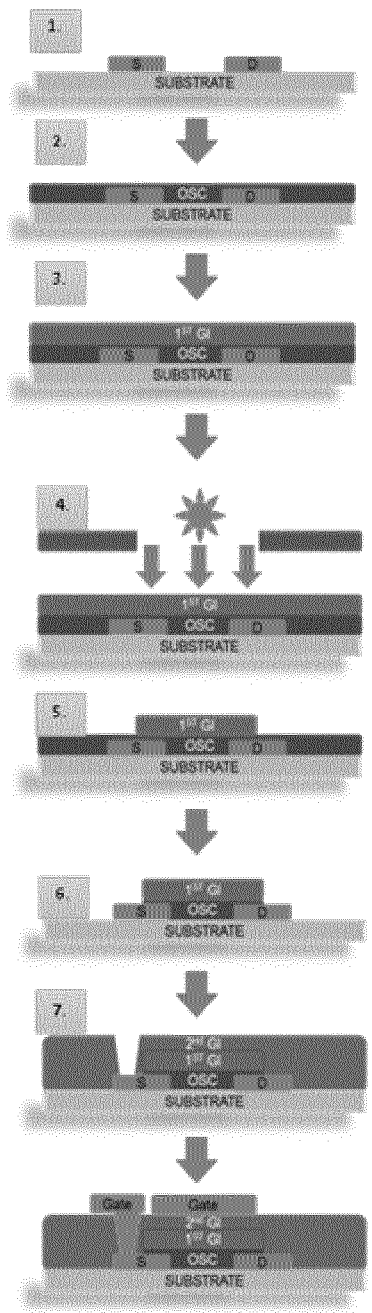
Figure 2:
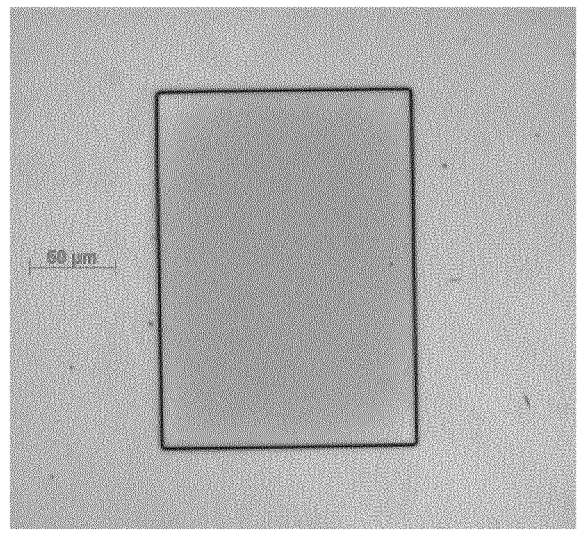
FIG. 2 shows the cured first dielectric layer after development.
Figure 3:
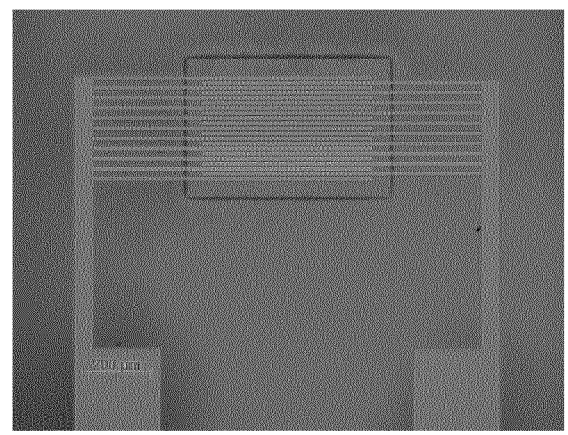
FIG. 3 shows the cured first dielectric layer as resist after the removal of the portions of the semiconducting layer not covered by the cured first dielectric layer.
Figure 4:
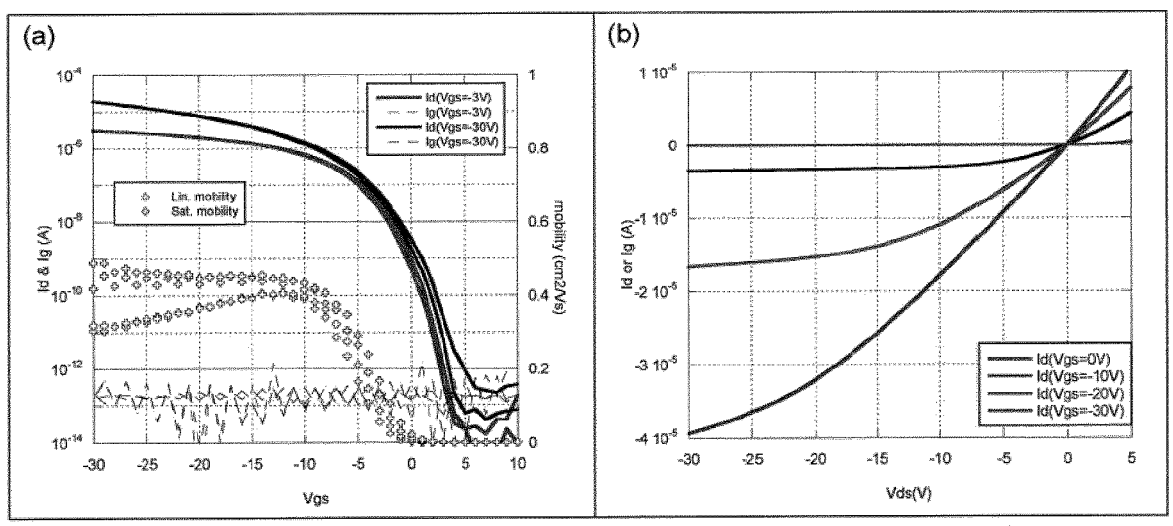

FIG. 4 shows the characteristics of the top gate organic field effect transistor of example 3 measured with a Keithley 4200-SCS semiconductor characterization system. The drain current $I_{ds}$ in relation to the gate voltage $V_{gs}$ (transfer curve) for the organic field effect transistor at a source voltage $V_{ds}$ of –3 V respectively, –30 V is shown in FIG. 4a. The drain current $I_{ds}$ in relation to the drain voltage $V_{ds}$ (output curve) for the organic field effect transistor at a gate voltage $V_{gs}$ of 0 V, –10 V, –20V and –30 V is shown in FIG. 4b.

EXAMPLES

Example 1

Preparation of a star-shaped polymer, which is a triblock polymer having a styrene-based inner block and two butadiene-based outer blocks with a mass ratio styrene:butadiene of 90:10 and an amount of 1,2-addition of butadiene in the polybutadiene blocks of 73% based on the total amount of butadiene in the polybutadiene block In a 10 L stainless steel reactor equipped with a cross-bar stirrer, 4872 ml (3800 g) cyclohexane, 256 mL (200 g) THF and 1 g 1,1-diphenylethylene (DPE) were heated to 30° C. and titrated with s-BuLi (1.4 M in cyclohexane) until a stable orange-red color remained (ca. 1.8 ml). Then, 7.14 mL s-BuLi (1.4 M in cyclohexane) was added to the reaction mixture and immediately 76 mL (50 g) butadiene were added under stirring. The temperature was kept at 60° C. controlled by the reactor jacket temperature after 20 min 990 ml. (900 g) styrene was added slowly to keep the temperature at 50° C. by jacket counter-cooling. After 25 min another 76 mL (50 g) butadiene were added. After 20 min 1.15 mL isopropanol was added and further stirred for 10 min. The colorless solution was transferred into two 5 Liter canisters and shaken together with 25 mL water and 50 g dry ice each for purpose of acidification.

Workup

The acidified mixture (solid content 20%) was precipitated into ethanol (10 fold volume containing 0.1% Kerobit TBK with respect to polymer), washed 3 times with 5 L ethanol and 3 times with 1 L distilled water on a Büchi funnel. Finally, the white powder was washed two times with 2.5 L ethanol and four times with 250 mL ethanol and finally dried at 50° C. under vacuum for 24 h. The obtained white powder, triblock polymer P1, had the following characteristics: Mn=220000 g/mol. Mw=330000 g/mol (as determined by gel-permeation chromatography with polystyrene standards). PDI 1.5. Amount of 1,2-addition of butadiene in the polybutadiene blocks=73% (as determined by $^1$H-NMR) based on the total amount of butadiene in the polybutadiene block.

Example 2

Preparation of Compositions A and B

Composition A is a solution of 8% by weight of P1 prepared as described in example 1 as first dielectric material in a mixture of propylene glycol monomethyl ether acetate (PGMEA) and cyclopentanone (CP) (70/30), and 4% by weight of 2,7-bis[2-(4-azido-2,3,5,6-tetrafluorophenyl) ethynyl]-9-heptyl-9-hexyl-fluorene as crosslinking agent carrying at least two azide groups based on the weight of P1. Composition A was prepared by mixing P1, the crosslinkinq agent and the solvent.

Composition B is a solution of 0.75% by weight of the diketopyrrolopyrrole polymer of example 4 of WO2010/049321 as organic semiconducting material in toluene. Formulation B was filtered through a 0.45 micrometer polytetrafluoroethylene (PTFE).

Example 3

Preparation of a Top-Gate, Bottom-Contact Organic Field Effect Transistor Comprising Composition A and Composition B Gold was sputtered on a polyethylene terephthalate substrate (PET) and patterned using lithography. The obtained source and drain electrodes had a thickness of approximately 50 nm. The channel length was 10 μm and the channel width was 250 μm. Composition B prepared as described in example 2 was applied on the source and drain electrodes by spin coating (1000 rpm, 30 seconds) and dried at 90° C. on a hot plate for 1 minute to form a 50 nm thick semiconducting layer. Composition A prepared as described in example 2 was applied on the semiconducting layer by spin coating (8000 rpm, 30 seconds), and dried at 80° C. on a hot plate for 2 minutes to form a first dielectric layer having a thickness of 180 nm. A lithographic photomask was aligned on top of the first dielectric layer, and the exposed portions of the first dielectric layer were cured under ambient conditions using light of 365 nm (radiation dosage 20 mJ/cm$^2$, Suss Mask aligner MA6). The cured first dielectric layer was developed by immersing into propylene glycol methyl ether acetate (PGMEA) for 1 minute followed by blowing with nitrogen and heating at 90° C. for 15 minutes. The portions of the semiconducting layer, which were not covered by the cured first dielectric layer, were etched out by oxygen plasma treatment (100 sccm, 40W, 2 minutes). Composition A prepared as described in example 2 was applied by spin coating (1500 rpm, 30 seconds) to form a second dielectric film, which was dried at 80° C. on a hot plate for 2 minutes to obtain a 500 nm thick second dielectric layer. The second dielectric layer was cured under ambient conditions using light of 365 nm (radiation dosage 20 mJ/cm², Suss Mask aligner MA6). Gate electrodes of gold having a thickness of approximately 50 nm were evaporated through a shadow mask on top of the dielectric layer.

The characteristics of the top gate, bottom contact organic field effect transistor were measured with a Keithley 4200-SCS semiconductor characterization system. The drain current $I_{ds}$ in relation to the gate voltage $V_{gs}$ (transfer curve) for the organic field effect transistor at a source voltage $V_{ds}$ of −3 V respectively, −30 V is shown in FIG. 4a. The drain current $I_{ds}$ in relation to the drain voltage $V_{ds}$ (output curve) for the organic field effect transistor at a gate voltage $V_{gs}$ of 0 V, −10 V, −20V and −30 V is shown in FIG. 4b.

The average values of the charge carrier mobility μ, the $I_{on}/I_{off}$ ratio (Vgs=−30 V), the onset voltage $V_{on}$ and the gate leakage current $I_g$ [@ $V_{gs}$=−30V, Vds=−30V] for the organic field effect transistor (OFET) are given in table 1.

TABLE 1

Characterization of the OFET of example 3.

| | μ [cm²/Vs] | $I_{on}/I_{off}$ ($V_{gs}$ = −30 V) | $V_{on}$ [V] | Ig (at $V_{gs}$ = −30 V, $V_{ds}$ = −30 V) |
|---|---|---|---|---|
| OFET example 3 | 0.48 | 8E+07 | 4 | 1.53E−13 |

The OFET of example 3 shows a very low gate leakage current $I_g$.

Example 4

Evaluation of the Effect of the Radiation on the Retention of the Cured First Dielectric Layer Formed from Layers Formed from Composition A Composition A prepared as described in example 2 was filtered through a 1 micrometer filter and applied on a silicon dioxide substrate by spin coating (1800 rpm, 30 seconds). The wet dielectric layer was pre-baked at 90° C. for 2 minutes on a hot plate to obtain a 400 nm thick layer. The dielectric layer was UV-cured using 365 nm (dose of 100 mJ/cm²) under ambient conditions.

Development of the dielectric layer was done by immersing the dielectric layer into a mixture of propylene glycol monomethyl ether acetate (PGMEA) and cyclopentanone (CP) (70/30) for 1 minute followed by heating at 90° C. for 5 minutes. The thickness of the dielectric layer was measured after curing before development (d1) and after development (d2) using Veeco Dektak 150 to obtain the film retention ratio (d2/d1). The film retention ratios (d2/d1) were determined.

The results are shown in table 2.

TABLE 2

| Polymer | styrene:butadiene [g:g] | cross-linker [%]ᵃ | polymer type | Mn [g/mol] | Mw [g/mol] | 1,2-addition butadiene [%] | d2/d1 [%] |
|---|---|---|---|---|---|---|---|
| P1 | 90:10 | 3 | triblock | 220000 | 330000 | 73 | 81 |

The cured dielectric layer formed from composition A shows a high film retention.

The invention claimed is:

1. A process for the preparation of a top-gate, bottom-contact organic field effect transistor on a substrate, which organic field effect transistor comprises source and drain electrodes, a semiconducting layer, a cured first dielectric layer and a gate electrode, and which process comprises the steps of i) applying a composition comprising an organic semiconducting material to form the semiconducting layer, ii) applying a composition comprising a first dielectric material and a crosslinking agent carrying at least two azide groups to form a first dielectric layer, iii) curing portions of the first dielectric layer by light treatment, iv) removing the uncured portions of the first dielectric layer, and v) removing the portions of the semiconducting layer that are not covered by the cured first dielectric layer, wherein the first dielectric material comprises a star-shaped polymer consisting of at least one polymer block A and at least two polymer blocks B, wherein each polymer block B is attached to the polymer block A, and wherein at least 60 mol % of the repeat units of polymer block B are selected from the group consisting of

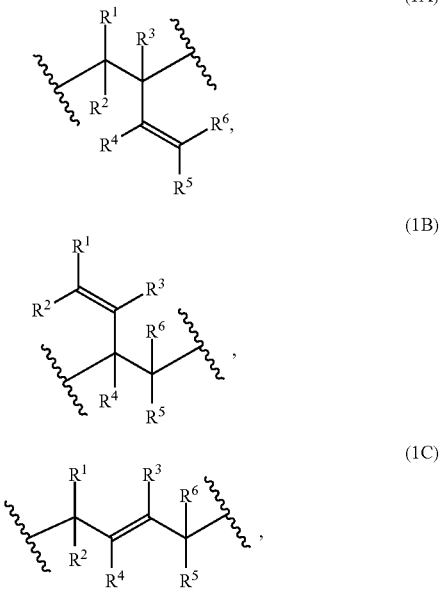

-continued

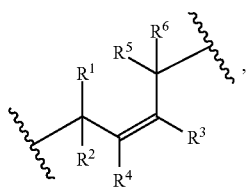 (1D)

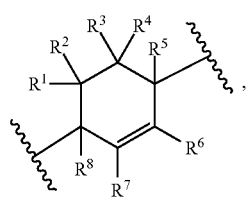 (1E)

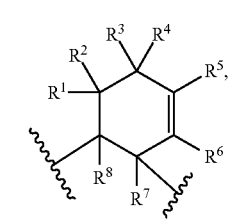 (1F)

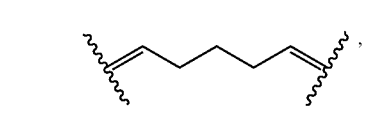 (1G)

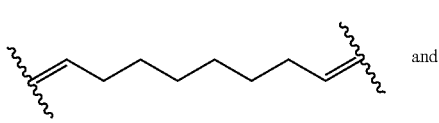 (1H)

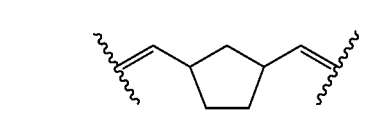 (1I)

wherein $R^1$, $R^2$, $R^3$, $R^4$, $R^5$, $R^6$, $R^7$ and $R^8$ are independently and at each occurrence H or $C_1$-$C_{10}$-alkyl.

2. The process of claim 1, wherein at least 80 mol % of the monomer units of the polymer block B are selected from the group consisting of

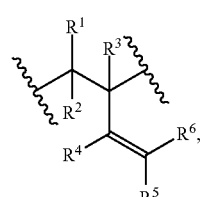 (1A)

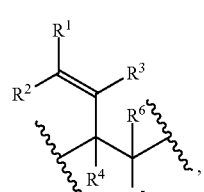 (1B)

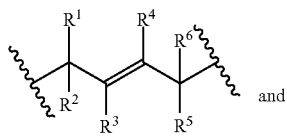 (1C)

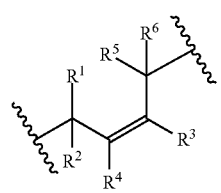 (1D)

wherein
$R^1$, $R^2$, $R^3$, $R^4$, $R^5$ and $R^6$ are H.

3. The process of claim 1, wherein at least 80 mol % of the monomer units of polymer block A are selected from the group consisting of

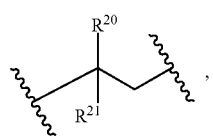 (4A)

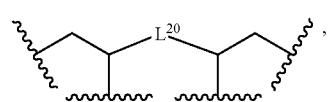 (4B)

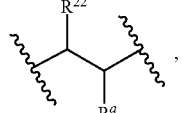 (4C)

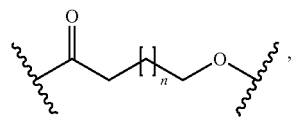 (4D)

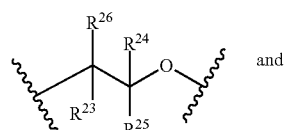 (4E)

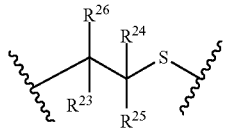 (4F)

wherein
$R^{20}$, $R^{21}$, $R^{22}$, $R^{23}$, $R^{24}$, $R^{25}$ and $R^{26}$ are independently and at each occurrence selected from the group consisting of H, $C_{6-14}$-aryl, 5 to 14 membered heteroaryl and $C_{1-30}$-alkyl, and
$R^a$ is C(O)OH, C(O)O$C_{1-30}$-alkyl, C(O)—H, C(O)$C_{6-14}$-aryl, C(O)N($C_{1-30}$-alkyl)$_2$, C(O)N($C_{6-14}$-aryl)$_2$, C(O)N($C_{1-30}$-alkyl)($C_{6-14}$-aryl), C(O)—$C_{6-14}$-aryl, C(O)—$C_{1-30}$-alkyl, O—$C_{6-14}$-aryl, O—$C_{1-30}$-alkyl, OC(O)$C_{1-30}$-alkyl, OC(O)$C_{6-14}$-aryl or CN, wherein
C$_{6-14}$-aryl and 5-14 membered heteroaryl can be substituted with one or more substituents selected from the group consisting of C$_{1-10}$-alkyl, C(O)OH, C(O)OC$_{1-10}$-alkyl, C(O)phenyl, C(O)N(C$_{1-10}$-alkyl)$_2$, C(O)N(phenyl)$_2$, C(O)N(C$_{1-10}$-alkyl)(phenyl), C(O)-phenyl, C(O)—C$_{1-10}$-alkyl, OH, O-phenyl, O—C$_{1-10}$-alkyl, OC(O)C$_{1-10}$-alkyl, OC(O)-phenyl, CN and NO$_2$, and C$_{1-30}$-alkyl can be substituted with one or more substituents selected from the group consisting of phenyl, C(O)OH, C(O)OC$_{1-10}$-alkyl, C(O)phenyl, C(O)N(C$_{1-10}$-alkyl)$_2$, C(O)N(phenyl)$_2$, C(O)N(C$_{1-10}$-alkyl)(phenyl), C(O)-phenyl, C(O)—C$_{1-10}$-alkyl, O-phenyl, O—C$_{1-10}$-alkyl, OC(O)C$_{1-10}$-alkyl, OC(O)-phenyl, Si(C$_{1-10}$-alkyl)$_3$, Si(phenyl)$_3$, CN and NO$_2$, n is an integer from 1 to 3,
and
L$^{20}$ is C$_{1-10}$-alkylene, C$_{2-10}$-alkenylene, C$_{2-10}$-alkynylene, C$_{6-14}$-arylene or S(O).

4. The process of claim 3, wherein at least 90 mol % of the monomer units of polymer block A is a monomer unit selected from the group consisting of

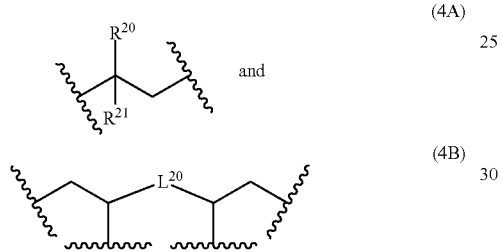

wherein
R$^{20}$ and R$^{21}$ are independently selected from the group consisting of H and C$_{6-14}$-aryl,
wherein
C$_{6-14}$-aryl can be substituted with one or more C$_{1-10}$-alkyl,
and
L$^{20}$ is C$_{6-14}$-arylene.

5. The process of claim 1, wherein the star-shaped polymer is a triblock polymer consisting of one polymer block A and two polymer blocks B, wherein each polymer block B is attached to the polymer block A, and wherein at least 60 mol % of the monomer units of polymer block B are selected from the group consisting of

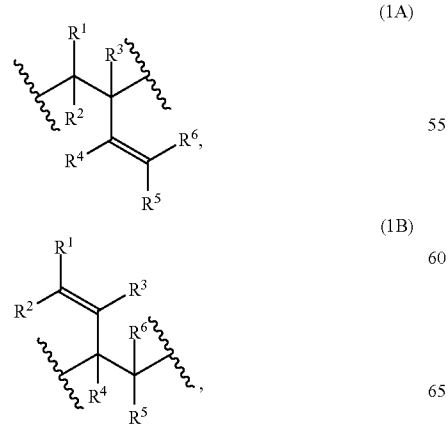

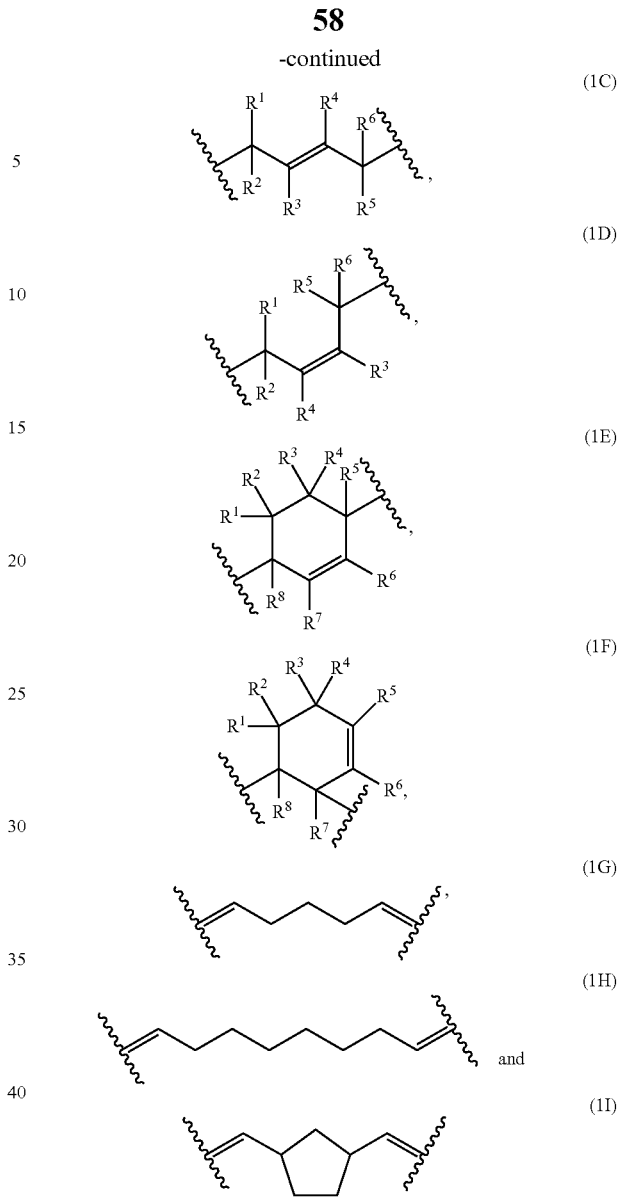

wherein
R$^1$, R$^2$, R$^3$, R$^4$, R$^5$, R$^6$, R$^7$ and R$^8$ are independently and at each occurrence H or C$_{1-4}$-alkyl,
with the proviso that at least one of the monomer units (1A) and (1B) is present, and that the ratio of [mols of monomer units (1A) and (1B)]/[mols of monomer units (1A), (1B), (1C) and (1D)] is at least 30%.

6. The process of claim 5, wherein at least 80 mol % of the monomer units of the polymer block B of the triblock polymer are selected from the group consisting of

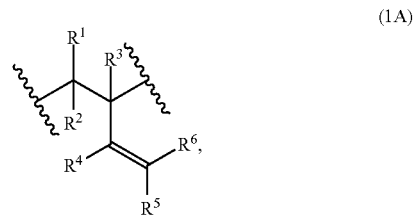

-continued

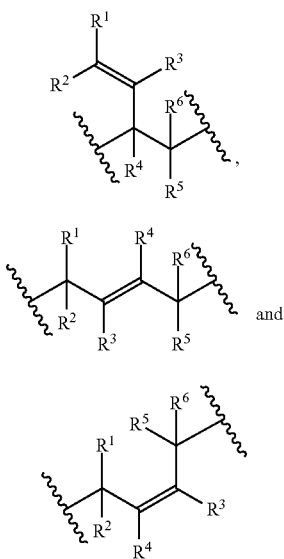

(1B)

(1C)

(1D)

wherein $R^1$, $R^2$, $R^3$, $R^4$, $R^5$ and $R^6$ are H, with the proviso that at least one of the monomer units (1A) and (1B) is present, and that the ratio of [mols of monomer units (1A) and (1B)]/[mols of monomer units (1A), (1B), (1C) and (1D)] is at least 70%.

7. The process of claim 5, wherein at least 80 mol % of the monomer units of polymerblock A of the triblock polymer are selected from the group consisting of

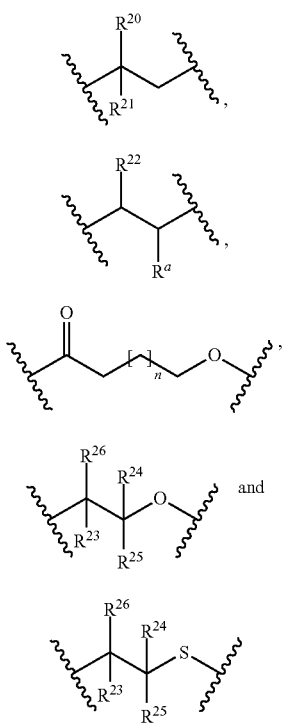

(4A)

(4C)

(4D)

(4E)

(4F)

wherein $R^{20}$, $R^{21}$, $R^{22}$, $R^{23}$, $R^{24}$, $R^{25}$ and $R^{26}$ are independently and at each occurrence selected from the group consisting of H, $C_{6-14}$-aryl, 5 to 14 membered heteroaryl and $C_{1-30}$-alkyl, and $R^a$ is C(O)OH, C(O)OC$_{1-30}$-alkyl, C(O)—H, C(O)C$_{6-14}$-aryl, C(O)N(C$_{1-30}$-alkyl)$_2$, C(O)N(C$_{6-14}$-aryl)$_2$, C(O)N (C$_{1-30}$-alkyl)(C$_{6-14}$-aryl), C(O)—C$_{6-14}$-aryl, C(O)—C$_{1-30}$-alkyl, O—C$_{6-14}$-aryl, O—C$_{1-30}$-alkyl, OC(O) C$_{1-30}$-alkyl, OC(O)C$_{6-14}$-aryl or CN, wherein $C_{6-14}$-aryl and 5 to 14 membered heteroaryl can be substituted with one or more substituents selected from the group consisting of C$_{1-10}$-alkyl, C(O)OH, C(O) OC$_{1-10}$-alkyl, C(O)phenyl, C(O)N(C$_{1-10}$-alkyl)$_2$, C(O) N(phenyl)$_2$, C(O)N(C$_{1-10}$-alkyl)(phenyl), C(O)-phenyl, C(O)—C$_{1-10}$-alkyl, OH, O-phenyl, O—C$_{1-10}$-alkyl, OC(O)C$_{1-10}$-alkyl, OC(O)-phenyl, CN and NO$_2$, and $C_{1-30}$-alkyl can be substituted with one or more substituents selected from the group consisting of with phenyl, C(O)OH, C(O)OC$_{1-10}$-alkyl, C(O)phenyl, C(O)N (C$_{1-10}$-alkyl)$_2$, C(O)N(phenyl)$_2$, C(O)N(C$_{1-10}$-alkyl) (phenyl), C(O)-phenyl, C(O)—C$_{1-10}$-alkyl, O-phenyl, O—C$_{1-10}$-alkyl, OC(O)C$_{1-10}$-alkyl, OC(O)-phenyl, Si(C$_{1-10}$-alkyl)$_3$, Si(phenyl)$_3$, and CN and NO$_2$, n is an integer from 1 to 3.

8. The process of claim 7, wherein at least 80 mol % of the monomer units of polymer block A of the triblock polymer are monomer units selected from the group consisting of

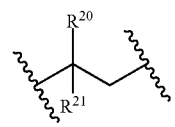

(4A)

wherein $R^{20}$ and $R^{21}$ are independently selected from the group consisting of H and $C_{6-14}$-aryl, wherein $C_{6-14}$-aryl can be substituted with one or more $C_{1-10}$-alkyl.

9. The process of claim 1, wherein the weight ratio of polymer block A/total polymer blocks B is from 60/40 to 96/4.

10. The process of claim 1, wherein the star-shaped polymers have a number average molecular weight Mn of at least 60000 g/mol and a weight average molecular weight Mw of at least 70000 g/mol, both as determined by gel permeation chromatography.

11. The process of claim 1, wherein the crosslinking agent carrying at least two azide groups is a crosslinking agent carrying two azide groups and is of formula

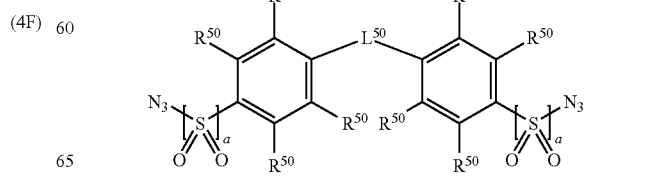

(2)

wherein
a is 0 or 1,
R$^{50}$ is at each occurrence selected from the group consisting of H, halogen, SO$_3$M and C$_{1-20}$-alkyl, which C$_{1-20}$-alkyl can be substituted with one or more halogen,
wherein M is H, Na, K or Li, and
L$^{50}$ is a linking group.

12. The process of claim 1, wherein the organic semiconducting material is at least one diketopyrrolopyrrole-based material, wherein the diketopyrrolopyrrole-based material is either
i) a diketopyrrolopyrrole-based polymer comprising units of formula

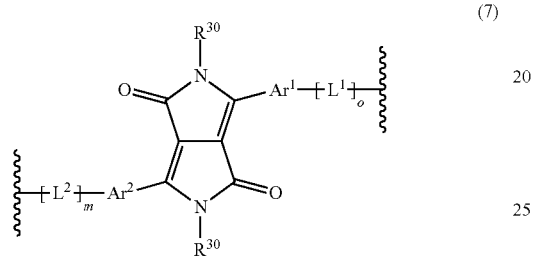

(7)

wherein
R$^{30}$ is at each occurrence C$_{1-30}$-alkyl, C$_{2-30}$-alkenyl or C$_{2-30}$-alkynyl, wherein C$_{1-30}$-alkyl, C$_{2-30}$-alkenyl and C$_{2-30}$-alkynyl can be substituted by one or more —Si(R$^b$)$_3$ or —OSi(R$^b$)$_3$, or one or more CH$_2$ groups of C$_{1-30}$-alkyl, C$_{2-30}$-alkenyl and C$_{2-30}$-alkynyl can be replaced by —Si(R$^b$)$_2$— or —[Si(R$^b$)$_2$—O]$_a$—Si(R$^b$)$_2$—,
wherein R$^b$ is at each occurrence C$_{1-10}$-alkyl, and a is an integer from 1 to 20,
o and m are independently 0 or 1, and
Ar$^1$ and Ar$^2$ are independently arylene or heteroarylene, wherein arylene and heteroarylene can be substituted with one or more C$_{1-30}$-alkyl, C$_{2-30}$-alkenyl, C$_{2-30}$-alkynyl, O—C$_{1-30}$-alkyl, aryl or heteroaryl, which C$_{1-30}$-alkyl, C$_{2-30}$-alkenyl, C$_{2-30}$-alkynyl, O—C$_{1-30}$-alkyl, aryl and heteroaryl can be substituted with one or more C$_{1-20}$-alkyl, O—C$_{1-20}$-alkyl or phenyl,
L$^1$ and L$^2$ are independently selected from the group consisting of

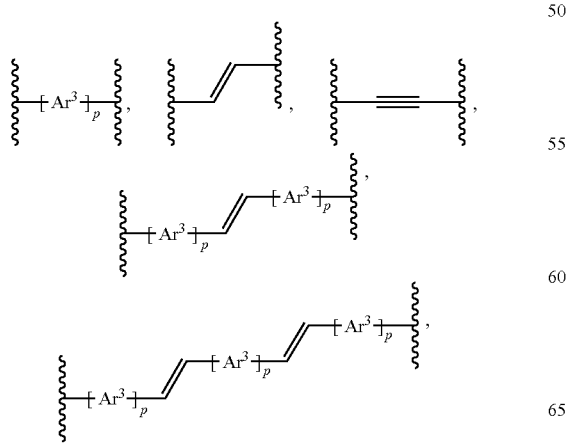

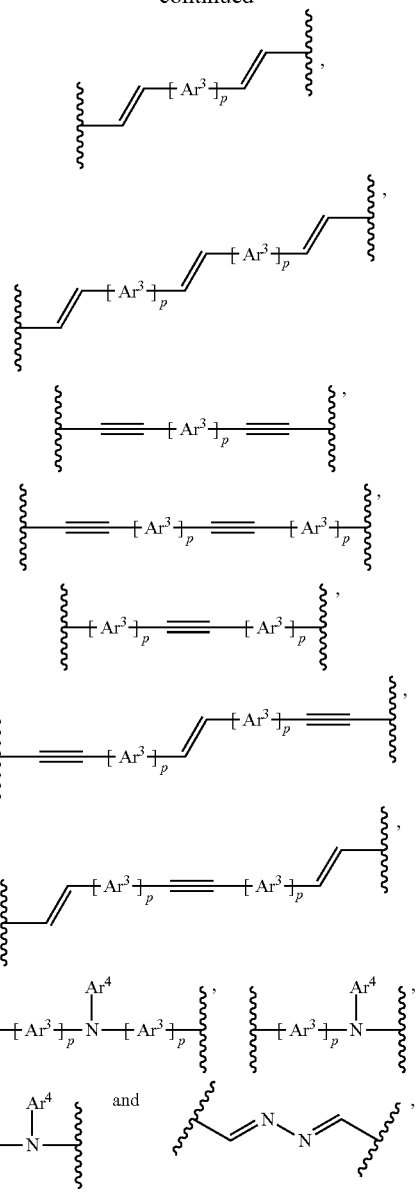

wherein
Ar$^3$ is at each occurrence arylene or heteroarylene, wherein arylene and heteroarylene can be substituted with one or more C$_{1-30}$-alkyl, C$_{2-30}$-alkenyl, C$_{2-30}$-alkynyl, O—C$_{1-30}$-alkyl, aryl or heteroaryl, which C$_{1-30}$-alkyl, C$_{2-30}$-alkenyl, C$_{2-30}$-alkynyl, O—C$_{1-30}$-alkyl, aryl and heteroaryl can be substituted with one or more C$_{1-20}$-alkyl, O—C$_{1-20}$-alkyl or phenyl; and wherein adjacent Ar$^3$ can be connected via a CR$^c$R$^c$, SiR$^c$R$^c$ or GeR$^c$R$^c$ linker, wherein R$^c$ is at each occurrence H, C$_{1-30}$-alkyl or aryl, which C$_{1-30}$-alkyl and aryl can be substituted with one or more C$_{1-20}$-alkyl, O—C$_{1-20}$-alkyl or phenyl,
p is at each occurrence an integer from 1 to 8, and
Ar$^4$ is at each occurrence aryl or heteroaryl, wherein aryl and heteroaryl can be substituted with one or more C$_{1-30}$-alkyl, O—C$_{1-30}$-alkyl or phenyl, which phenyl can be substituted with C$_{1-20}$-alkyl or O—C$_{1-20}$-alkyl, or
ii) a diketopyrrolopyrrole-based small molecule of formulae (8) or (9)

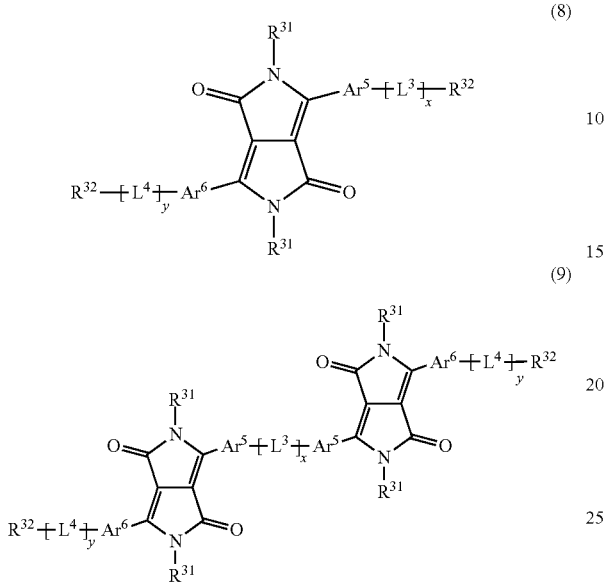

wherein
$R^{31}$ is at each occurrence $C_{1-30}$-alkyl, $C_{2-30}$-alkenyl or $C_{2-30}$-alkynyl, wherein $C_{1-30}$-alkyl, $C_{2-30}$-alkenyl and $C_{2-30}$-alkynyl can be substituted by $-Si(R^d)_3$ or $-OSi(R^d)_3$, or one or more $CH_2$ groups of $C_{1-30}$-alkyl, $C_{2-30}$-alkenyl and $C_{2-30}$-alkynyl can be replaced by $-Si(R^d)_2-$ or $-[Si(R^d)_2-O]_a-Si(R^d)_2-$,
wherein $R^d$ is at each occurrence $C_{1-10}$-alkyl, and a is an integer from 1 to 20,
$R^{32}$ is H, CN, $C_{1-20}$-alkyl, $C_{2-20}$-alkenyl, $C_{2-20}$-alkynyl, $O-C_{1-20}$-alkyl, aryl or heteroaryl, which $C_{1-20}$-alkyl, $C_{2-20}$-alkenyl, $C_{2-20}$-alkynyl, $O-C_{1-20}$-alkyl, aryl and heteroaryl can be substituted with one or more $C_{1-6}$-alkyl, $O-C_{1-6}$-alkyl or phenyl,
x and y are independently 0 or 1, and
$Ar^5$ and $Ar^6$ are independently arylene or heteroarylene, wherein arylene and heteroarylene can be substituted with one or more $C_{1-30}$-alkyl, $C_{2-30}$-alkenyl, $C_{2-30}$-alkynyl, $O-C_{1-30}$-alkyl, aryl or heteroaryl, which $C_{1-30}$-alkyl, $C_{2-30}$-alkenyl, $C_{2-30}$-alkynyl, $O-C_{1-30}$-alkyl, aryl and heteroaryl can be substituted with one or more $C_{1-20}$-alkyl, $O-C_{1-20}$-alkyl or phenyl;
$L^3$ and $L^4$ are independently selected from the group consisting of

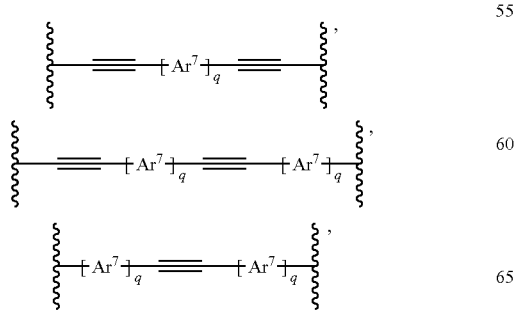

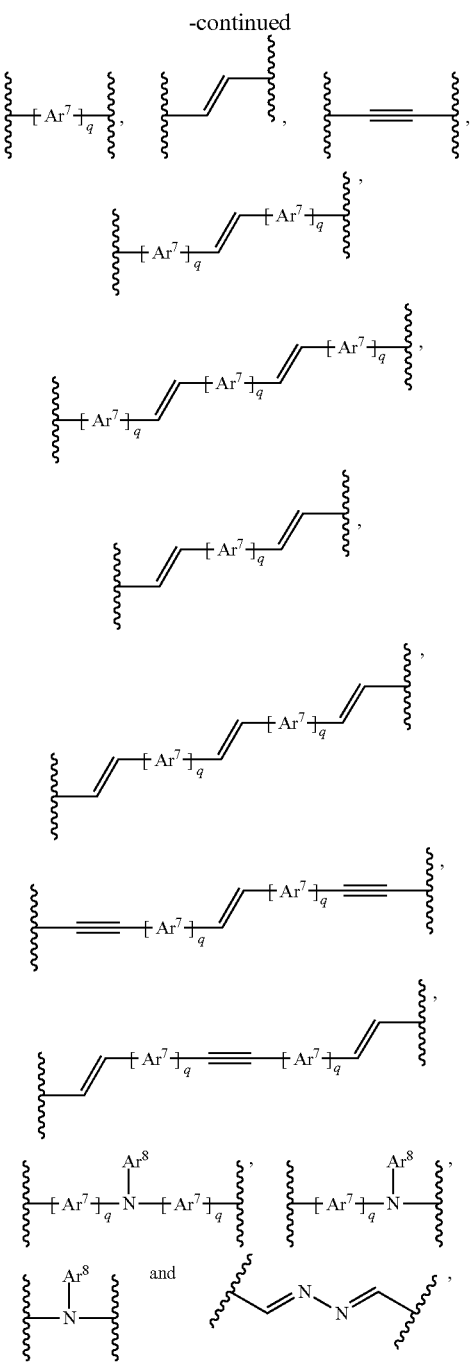

wherein
$Ar^7$ is at each occurrence arylene or heteroarylene, wherein arylene and heteroarylene can be substituted with one or more $C_{1-30}$-alkyl, $C_{2-30}$-alkenyl, $C_{2-30}$-alkynyl, $O-C_{1-30}$-alkyl, aryl or heteroaryl, which $C_{1-30}$-alkyl, $C_{2-30}$-alkenyl, $C_{2-30}$-alkynyl, $O-C_{1-30}$-alkyl, aryl and heteroaryl can be substituted with one or more $C_{1-20}$-alkyl, $O-C_{1-20}$-alkyl or phenyl; and wherein adjacent $Ar^7$ can be connected via an $CR^eR^e$, $SiR^eR^e$ or $GeR^eR^e$ linker, wherein $R^e$ is at each occurrence H, $C_{1-30}$-alkyl or aryl, which $C_{1-30}$-alkyl and aryl can be substituted with one or more $C_{1-20}$-alkyl, $O-C_{1-20}$-alkyl or phenyl, q is at each occurrence an integer from 1 to 8, and $Ar^8$ is at each occurrence aryl or heteroaryl, wherein aryl and heteroaryl can be substituted with one or more $C_{1-30}$-alkyl, O—$C_{1-30}$-alkyl or phenyl, which phenyl can be substituted with $C_{1-20}$-alkyl or O—$C_{1-20}$-alkyl.

13. The process of claim 1 further comprising step vi) of applying a composition comprising a second dielectric material on top of the cured first dielectric layer to form a second dielectric layer.

14. The process of claim 13, wherein the cured first dielectric layer and the semiconducting layer cover the path between the source and drain electrodes, and optionally also partially or completely covers the source and drain electrodes.

15. The process of claim 13, wherein the composition comprising a second dielectric material is applied on top of the cured first dielectric layer in a way that the cured first dielectric layer and the semiconducting layer are embedded in the second dielectric layer.

* * * * *